(12) United States Patent
Taguchi et al.

(10) Patent No.: US 6,426,620 B1
(45) Date of Patent: *Jul. 30, 2002

(54) MAGNETIC FIELD SENSING ELEMENT AND DEVICE HAVING MAGNETORESISTANCE ELEMENT AND INTEGRATED CIRCUIT FORMED ON THE SAME SUBSTRATE

(75) Inventors: Motohisa Taguchi; Izuru Shinjo; Yuji Kawano; Tatsuya Fukami; Kazuhiko Tsutsumi; Yuuichi Sakai; Naoki Hiraoka; Yasuyoshi Hatazawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/307,751

(22) Filed: May 10, 1999

(30) Foreign Application Priority Data

May 13, 1998 (JP) ............................. 10-130732
Mar. 26, 1999 (JP) ............................. 11-083502

(51) Int. Cl.⁷ .............................. G01B 7/00; G01P 3/66; G01R 33/09
(52) U.S. Cl. ................... 324/207.21; 324/252; 257/427
(58) Field of Search ................... 324/207.21, 207.25, 324/174, 252; 327/510, 511; 338/32 R; 428/692; 257/421, 427

(56) References Cited

U.S. PATENT DOCUMENTS

4,853,632 A * 8/1989 Nagano et al. ........ 324/207.21
6,072,311 A * 6/2000 Shinjo et al. ............... 324/174

FOREIGN PATENT DOCUMENTS

| DE | 196-22-040 | 12/1996 |
| DE | 196-49-400 | 12/1997 |
| DE | 197-44-090 | 10/1998 |
| EP | 0-660-127 | 6/1995 |
| EP | 0-801-313 | 10/1997 |
| FR | 2 648 942 | 12/1990 |
| JP | 3-52111 | 3/1991 |

OTHER PUBLICATIONS

"Magnetoresistance of Multilayers", Journal of the Applied Magnetism Society of Japan, vol. 15, No.1 51991, P 813–821 (No translation).

* cited by examiner

*Primary Examiner*—Walter E. Snow
(74) *Attorney, Agent, or Firm*—Sughrue Mion, PLLC

(57) ABSTRACT

A magnetic field sensing element comprises an underlayer formed on a substrate, a giant magnetoresistance element formed on the underlayer for detecting a change in a magnetic field, and an integrated circuit formed on the substrate for carrying out predetermined arithmetic processing based on a change in a magnetic field detected by the giant magnetoresistance element, wherein the giant magnetoresistance element and the integrated circuit are formed on the same surface.

19 Claims, 31 Drawing Sheets

US 6,426,620 B1

MAGNETIC FIELD SENSING ELEMENT AND DEVICE HAVING MAGNETORESISTANCE ELEMENT AND INTEGRATED CIRCUIT FORMED ON THE SAME SUBSTRATE

BACKGROUND OF THE INVENTION

1. Field of the Invention

The present invention relates to a magnetic field sensing element for detecting a change in a magnetic field, and more particularly, such an element used in a device for detecting the rotation of a magnetic body.

2. Description of the Related Art

Generally, a magnetoresistance element (hereinafter referred to as an MR element) is an element whose resistance changes depending on an angle formed by the direction of magnetization of a ferromagnetic body (Ni—Fe or Ni—Co, for example) thin film and the direction of an electric current. The resistance of such an MR element is minimum when the direction of an electric current and the direction of magnetization cross at right angles to each other, and is maximum when the angle formed by the direction of an electric current and the direction of magnetization is 0°, that is, when the directions are the same or completely opposite. Such a change in resistance is referred to as an MR ratio, and is typically 2—3% with respect to Ni—Fe and 5—6% with respect to Ni—Co.

FIGS. 34 and 35 are a side view and a perspective view, respectively, showing the structure of a conventional magnetic field sensing device.

As shown in FIG. 34, the conventional magnetic field sensing device comprises a rotation axis 41, a magnetic rotating body 42 which has at least one concavity and convexity and which rotates synchronously with the rotation of the rotation axis 41, an MR element 43 arranged with a predetermined gap between itself and the magnetic rotating body 42, a magnet 44 for applying a magnetic field to the MR element 43, and an integrated circuit 45 for processing an output of the MR element 43. The MR element 43 has a magnetoresistance pattern 46 and a thin film surface (magnetic-sensitive surface) 47.

In such a magnetic field sensing device, rotation of the magnetic rotating body 42 causes a change in the magnetic field penetrating the thin film surface 47 which is the magnetic-sensitive surface of the MR element 43, resulting in a change in the resistance of the magnetoresistance pattern 46.

However, since the output level of the MR element as a magnetic field sensing element used in such a magnetic field sensing device is low, the detection can not be highly accurate. In order to solve this problem, a magnetic field sensing element using a giant magnetoresistance element (hereinafter referred to as a GMR element) having a high output level has been recently proposed.

FIG. 36 is a graph showing the characteristics of a conventional GMR element.

The GMR element showing the characteristics in FIG. 36 is a laminated body (Fe/Cr, permalloy/Cu/Co/Cu, Co/Cu, FeCo/Cu) as a so-called artificial lattice film where magnetic layers and non-magnetic layers with thickness of several angstroms to several dozen angstroms are alternately laminated. This is disclosed in an article entitled "Magnetoresistance Effects of Artificial Lattices," Japan Applied Magnetics Society Transactions, Vol. 15, No. 51991, pp. 813—821. The laminated body has a much larger MR effect (MR ratio) than the above-mentioned MR element, and, at the same time, is an element which shows the same change in resistance irrespective of the angle formed by the direction of an external magnetic field and the direction of an electric current.

In order to detect a change in the magnetic field, the GMR element substantially forms a magnetic-sensitive surface. Electrodes are formed at the respective ends of the magnetic-sensitive surface to form a bridge circuit. A constant-voltage and constant-current power source is connected between the two facing electrodes of the bridge circuit. The change in the magnetic field acting on the GMR element is detected by converting a change in the resistance of the GMR element into a change in voltage.

FIGS. 37 and 38 are a side view and a perspective view, respectively, showing the structure of a magnetic field sensing device using a conventional GMR element.

In FIGS. 37 and 38, the magnetic field sensing device comprises a rotation axis 41, a magnetic rotating body 42 as a means for imparting a change to a magnetic field, the body having at least one concavity and convexity and having rotatable synchronously with the rotation of the rotation axis 41, a GMR element 48 arranged with a predetermined gap between the magnetic rotating body 42, a magnet 44 as a magnetic field generating means for applying a magnetic field to the GMR element 48, and an integrated circuit 45 for processing an output of the GMR element 48. The GMR element 48 has a magnetoresistance pattern 49 as a magnetic-sensitive pattern and a thin film surface 50.

In such a magnetic field sensing device, rotation of the magnetic rotating body 42 causes a change in the magnetic field penetrating the thin film surface (magnetic-sensitive surface) 47 of the GMR element 48, resulting in a change in the resistance of the magnetoresistance pattern 49.

FIG. 39 is a block diagram showing the magnetic field sensing device using the conventional GMR element.

FIG. 40 is a block diagram showing the detail of the magnetic field sensing device using the conventional GMR element.

The magnetic field sensing device shown in FIGS. 39 and 40 is arranged with a predetermined gap between the magnetic rotating body 42 and itself, and comprises a Wheatstone bridge circuit 51 using the GMR element 48 to which a magnetic field is applied by the magnet 44, a differential amplification circuit 52 for amplifying the output of the Wheatstone bridge circuit 51, a comparison circuit 53 for comparing the output of the differential amplification circuit 52 with a reference value to output a signal of either "0" or "1," and an output circuit 54 that switches in response to the output of the comparison circuit 53.

FIG. 41 shows an example of the structure of a circuit of the magnetic field sensing device using the conventional GMR element.

In FIG. 41, the Wheatstone bridge circuit 51 has on its respective sides GMR elements 48a, 48b, 48c, and 48d, for example, with the GMR elements 48a and 48c being connected with a power source terminal VCC, the GMR elements 48 and 48d being polished, the other ends of the GMR elements 48a and 48b being connected with a connection 55, and the other ends of the GMR elements 48c and 48d being connected with a connection 56.

The connection 55 of the Wheatstone bridge circuit 51 is connected with an inverting input terminal of an amplifier 59 of a differential amplification circuit 58 via a resistor 57. The connection 56 is connected with a non-inverting input terminal of the amplifier 59 via a resistor 60, and is further connected with a voltage dividing circuit 62 for forming a reference voltage based on the voltage supplied from the power source terminal VCC via a resistor 61.

An output terminal of the amplifier 59 is connected with its own inverting input terminal via a resistor 63, and is further connected with an inverting input terminal of a comparison circuit 64. A non-inverting input terminal of the comparison circuit 64 is connected with a voltage dividing circuit 66 for forming a reference voltage based on the voltage supplied from the power source terminal VCC, and is further connected with an output terminal of the comparison circuit 64 via a resistor 67.

An output end of the comparison circuit 64 is connected with a base of a transistor 69 of an output circuit 68. The collector of the transistor 69 is connected with an output terminal of the output circuit 68 and is further connected with the power source terminal VCC via a resistor 71. The emitter of the transistor 69 is polished.

FIG. 42 shows the structure of the conventional magnetic field sensing element.

FIG. 43 is a graph showing operating characteristics of the conventional magnetic field sensing element.

As shown in FIG. 42, the Wheatstone bridge comprises the GMR element 48 (formed of 48a, 48b, 48c, and 48d).

As shown in FIG. 43, rotation of the magnetic rotating body 42 causes a change in the magnetic field supplied to the GMR element 48 (48a to 48d), and output corresponding to the concavities and the convexities of the magnetic rotating body 42 can be obtained at an output end of the differential amplification circuit 58.

The output of the differential amplification circuit 58 is supplied to the comparison circuit 64, compared with the reference value as the comparison level, and converted into a signal of either "0" or "1," and the signal is further made into a waveform by the output circuit 68. As a result, as shown in FIG. 43, an output of "0" or "1" with steep leading and trailing edges can be obtained at the output terminal 70.

However, since the GMR element used in the above-mentioned magnetic field sensing element is very sensitive, it is necessary to, for example, smooth the surface of the underlayer on which the GMR element is formed in order to fully bring out its characteristics. Therefore, it is difficult to, for example, form the GMR element on the same surface the integrated circuit is formed.

This makes it necessary to separately form the GMR element and the integrated circuit and then electrically connect them with each other, which leads to low productivity and high manufacturing costs.

Further, since the output of the comparison circuit depends on the gap between the magnetic rotating body and the magnetic field sensing element, there is a problem in that the so-called gap characteristics are bad.

SUMMARY OF THE INVENTION

The present invention is made to solve the problems mentioned above, and therefore an object of the present invention is to provide a magnetic field sensing element with low cost, high productivity, and high detection accuracy, and a magnetic field sensing device using the magnetic field sensing element.

According to an aspect of the present invention, there is provided a magnetic field sensing element comprising, an underlayer formed on a substrate, a giant magnetoresistance element formed on the underlayer for detecting a change in a magnetic field, and an integrated circuit formed on the underlayer for carrying out predetermined arithmetic processing based on a change in a magnetic field detected by the giant magnetoresistance element, wherein the giant magnetoresistance element and the integrated circuit are formed on the same surface.

In a preferred form of the invention, a metal film formed on the underlayer for forming the integrated circuit, which is not in a region for forming the integrated circuit, is patterned to form first wiring for connecting the giant magnetoresistance element and the integrated circuit.

In accordance with another aspect of the present invention, the first wiring are formed by wet etching of the metal film and has a tapered shape in section.

In accordance with a further aspect of the present invention, a first level difference buffer layer is formed on the underlayer in a region for forming the giant magnetoresistance element to decrease a difference in the levels between the surface of the metal film for forming the first wiring and a surface for forming the giant magnetoresistance element, and the giant magnetoresistance element is formed on the first level difference buffer layer.

In a further preferred form of the invention, the first level difference buffer layer is formed of an insulating layer, and the level difference between the first level difference buffer layer and the surface of the metal film for forming the first wiring is sufficiently smaller than the film thickness of the giant magnetoresistance element.

In a still further preferred form of the invention, the first level difference buffer layer is a resist layer or resin layer having fluid characteristics formed by spin coating, and the level difference between the first level difference buffer layer and the surface of the metal film for forming the first wiring is sufficiently smaller than the film thickness of the giant magnetoresistance element.

In accordance with a still further aspect of the invention, for the purpose of forming the giant magnetoresistance element, after a giant magnetoresistance element film is formed on the entire surface of the integrated circuit and the first wiring, a portion of the giant magnetoresistance element film on the first wiring then being removed so that the giant magnetoresistance element film formed on the integrated circuit is left unremoved, a protective film then being formed on the unremoved portion of giant magnetoresistance element film.

In accordance with a yet further aspect of the invention, there is provided a magnetic field sensing element comprising, an integrated circuit, an underlayer, and a metal pad formed on a substrate in the order stated, provided with, a second level difference buffer layer formed on the underlayer and the metal pad to absorb the level difference between the surface of the underlayer and the surface of the metal pad, and a giant magnetoresistance element formed on the second level difference buffer layer.

In a further preferred form of the invention, the second level difference buffer layer has a surface that is smoothed by polishing, and the giant magnetoresistance element is formed on the smoothed surface of the second level difference buffer layer.

In a further preferred form of the invention, the second level difference buffer layer is a resist layer or resin layer having a smoothed surface formed by spin coating and the giant magnetoresistance element is formed on the smoothed surface of the smoothed resist layer or resin layer.

In accordance with a yet further aspect of the invention, there is provided a magnetic field sensing element comprising an underlayer formed on one surface of a substrate, a giant magnetoresistance element formed on the underlayer, for detecting a change in a magnetic field, and an integrated circuit formed on the surface opposite to the surface where the giant magnetoresistance element of the substrate is formed, for carrying out predetermined arithmetic processing based on a change in a magnetic field detected by the giant magnetoresistance element.

In a further preferred form of the invention, an underlayer and a giant magnetoresistance element are further formed on the integrated circuit formed on the other surface of the substrate.

In a further preferred form of the present invention, a film, which is identical with the film composing the giant magnetoresistance element, is formed on the first wiring.

In a further preferred form of the present invention, more than half of the top surface and the side surface of the first wiring is coated with the same film that forms the giant magnetoresistance element.

In accordance with a yet further aspect of the present invention, there is provided a magnetic field sensing element comprising an integrated circuit formed on a substrate and having a capacitor portion, an underlayer formed on the integrated circuit, a second metal layer formed on the underlayer, and a giant magnetoresistance element formed on the capacitor portion of the integrated circuit.

In a further preferred form of the present invention, the giant magnetoresistance element is connected with the integrated circuit through second wiring formed by patterning the second metal layer.

In a further preferred form of the present invention, a film, which is identical with the film composing the giant magnetoresistance element, is formed on the second wiring.

In a further preferred form of the present invention, more than half of the top surface and the side surface of the second wiring is coated with the same film that forms the giant magnetoresistance element.

In a further preferred form of the present invention, the giant magnetoresistance element is connected with the integrated circuit through a bonding wire.

In a further preferred form of the present invention, the giant magnetoresistance element is formed by repeatedly laminating a Fe(x)Co(1−x) layer ($0 \leq x \leq 0.3$) and a Cu layer, film thickness of the Cu layers per layer being set to such a film thickness that causes the change rate of magnetoresistance in a layer of the Cu layers to be around the second peak, and protective films on the giant magnetoresistance element is formed by spin coating or by means of low-thermal plasma CVD method.

In a further preferred form of the present invention, a diode is formed between the giant magnetoresistance element and the integrated circuit.

In a further preferred form of the invention, mean surface roughness of the underlayer is 50 Å or less. In a further preferred form of the invention, mean surface roughness of the underlayer is between 1 Å and 25 Å.

In a further preferred form of the invention, further comprising a differential amplifier and a comparator on a line for transmitting output of the giant magnetoresistance element to the integrated circuit, wherein the comparator sets the output of the differential amplifier being constant irrespective of the distance between the giant magnetoresistance element and the object to be observed by the giant magnetoresistance element, as the criterion for deciding the position of an object to be observed.

In accordance with a yet further aspect of the present invention, there is provided a magnetic field sensing device which comprises a magnetic rotating body being rotatable about the rotation axis and having a concavity and a convexity along its outer periphery, a magnet disposed so as to face the outer periphery of the magnetic rotating body and a magnetic field sensing element, which is attached to the magnet surface opposing the outer periphery of the magnetic rotating body, wherein the magnetic field sensing element detects a change in a magnetic field generated between the magnetic rotating body and the magnet during the rotation of the magnetic rotating body, and wherein the device detects a rotation amount of the magnetic rotating body on the basis of the detected change in the magnetic field.

DETAILED DESCRIPTION OF THE PREFERRED EMBODIMENTS

Preferred embodiments of a magnetic field sensing element according to the present invention will now be described, while referring to the accompanying drawings.

Embodiment 1

Figure 1:
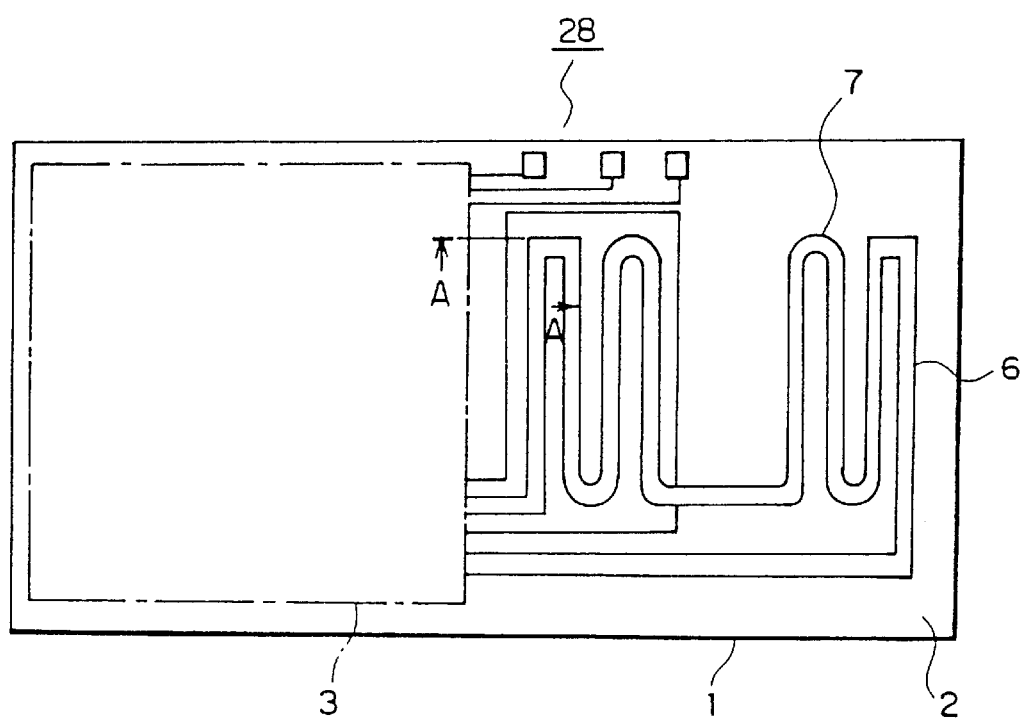
FIG. 1 is a plan view showing the structure of a magnetic field sensing element according to Embodiment 1 of the present invention.
Figure 2:
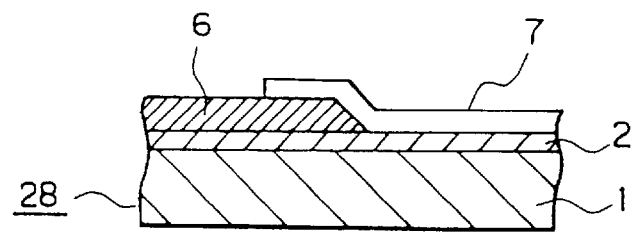
FIG. 2 is a sectional view showing the structure of the magnetic field sensing element according to Embodiment 1 of the present invention.
Figure 3:
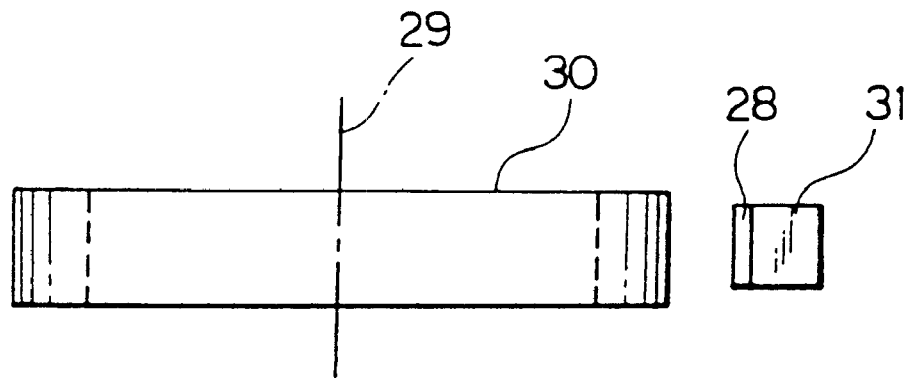
FIG. 3 is a side view showing the structure of the magnetic field sensing device according to Embodiment 1 of the present invention.
Figure 4:
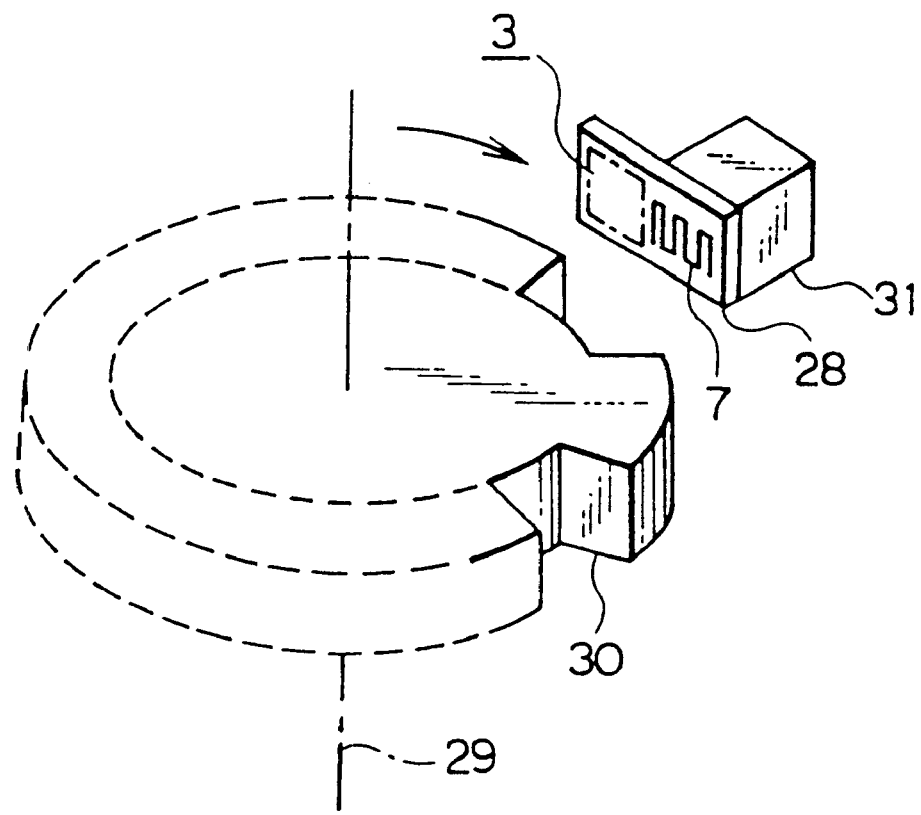
FIG. 4 is a perspective view showing the structure of the magnetic field sensing device according to Embodiment 1 of the present invention.
Figure 5:
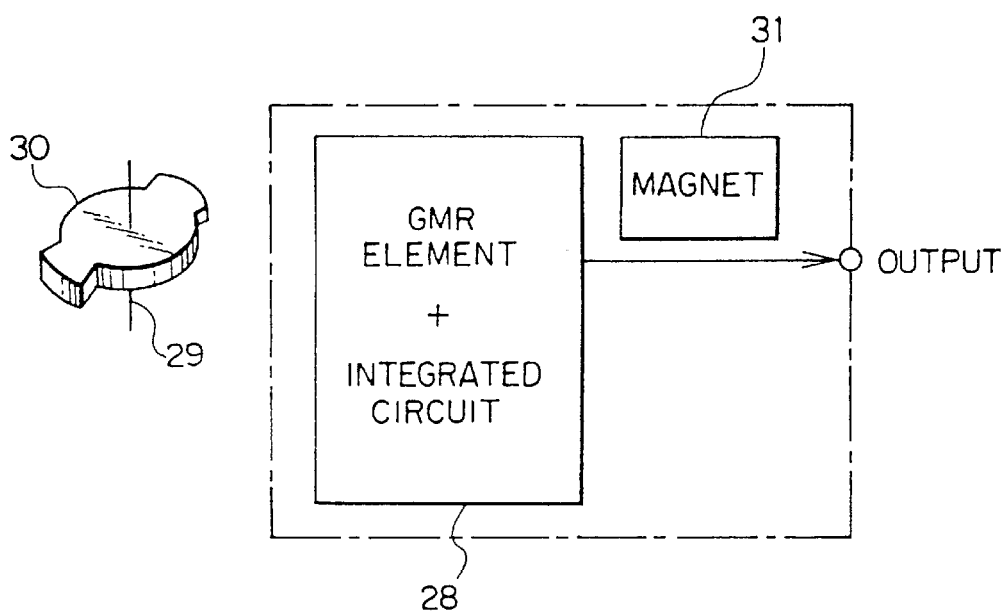
FIG. 5 is a block diagram schematically showing the internal structure of a magnetic field sensing device according to Embodiment 1 of the present invention.

FIG. 1 is a plan view showing the structure of a magnetic field sensing element according to Embodiment 1 of the present invention. FIG. 2 is a sectional view taken along the line A—A of FIG. 1. FIGS. 3 and 4 are a side view and a perspective view, respectively, showing the structure of a magnetic field sensing device according to Embodiment 1 of the present invention. FIG. 5 is a block diagram schematically showing the internal structure of the magnetic field sensing device according to Embodiment 1 of the present invention.

As shown in FIGS. 1 and 2, a magnetic field sensing element 28 according to Embodiment 1 of the present invention comprises metal wiring 6 as first wiring and a GMR element 7 on an underlayer 2 formed on a substrate 1.

As shown in FIGS. 3 and 4, the magnetic field sensing device comprises a magnetic rotating body 30 which has at least one concavity and convexity along its outer periphery and which rotates synchronously with the rotation of a rotation axis 29, a magnetic field sensing element 28 arranged so as to face the outer periphery of the magnetic rotating body 30 with a predetermined gap therebetween, a magnet 31 for applying a magnetic field to a GMR element 7 of the magnetic field sensing element 28, and an integrated circuit 3 for processing output of the GMR element 7.

In Embodiment 1, the GMR element is formed on the same surface the integrated circuit is formed.

As described above, since the GMR element is formed of a super thin film layer with a thickness of several Å to several dozen Å, it is liable to be effected by subtle unevenness of the surface of the underlayer on which the GMR element is arranged.

When the unevenness of the surface of the underlayer is considerable, the GMR element does not show any change in resistance.

As the surface of the underlayer becomes smoother, the rate of change in resistance of the GMR element becomes larger. However, the magnetic field for generating the change in resistance is required to be larger accordingly.

Figure 6:
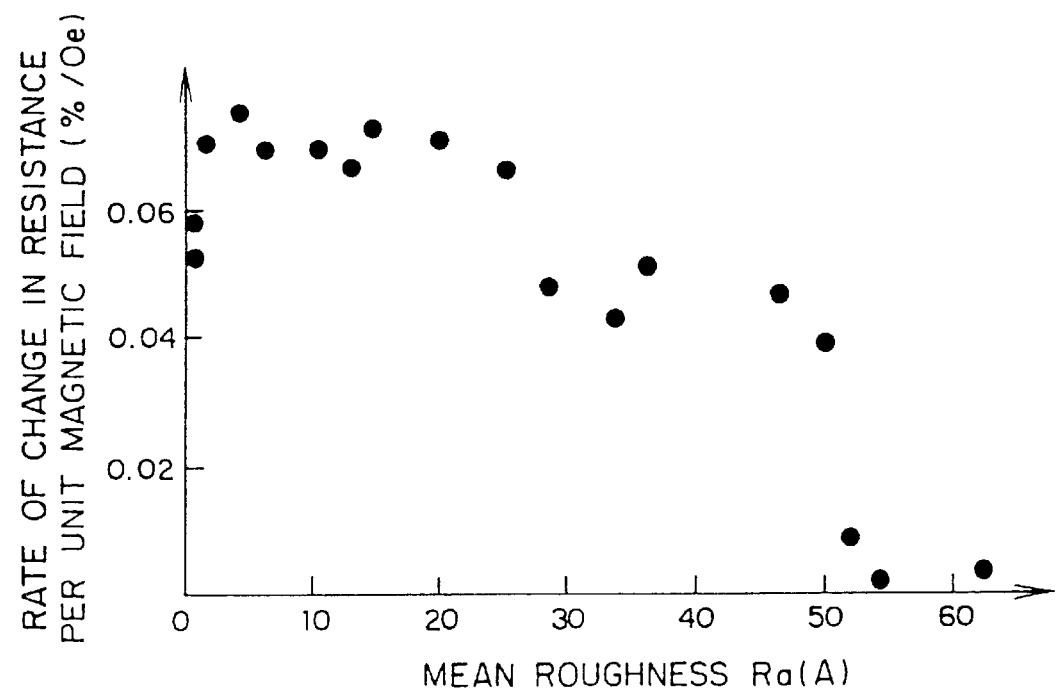
FIG. 6 is a graph showing the characteristics of the relationship between the rate of change in resistance per unit of magnetic field and the surface roughness of the underlayer of the magnetic field sensing element of the present invention.

FIG. 6 is a graph showing the characteristics of the relationship between the rate of change in resistance per unit magnetic field and the surface roughness of the underlayer of the magnetic field sensing element.

The rate of change in resistance per unit magnetic field (hereinafter referred to as the magnetic field sensitivity) shown in FIG. 6 shows characteristics in the case where, as a substrate on which a GMR element is arranged, a substrate on which an underlayer of Si, an Si thermal oxide film, silicon oxide, silicon nitride, tantalum oxide or the like is formed by sputtering, a soda glass substrate, and various kinds of ceramic substrates are used.

The smoothness of the surface of the underlayer can be measured by using AFM (Atomic Force Microscope) or the like. In FIG. 6, the smoothness is represented by the mean roughness (Ra).

As can be seen in FIG. 6, a large magnetic field sensitivity of the GMR element can be obtained when the average of surface roughness Ra is 50 Å or less, and in particular, the best magnetic field sensitivity can be obtained when the average of surface roughness Ra is 1 Å or more and 25 Å or less.

Further, the GMR element is electrically connected with the integrated circuit by a metal film formed in the process of forming the integrated circuit. In the integrated circuit, elements such as a transistor and a resistance are electrically connected by a metal film generally composed of an aluminum film. The GMR element is electrically connected with the integrated circuit by forming this aluminum film in a predetermined region necessary for connecting the GMR element with the integrated circuit.

The patterning process in which the wiring is formed from this aluminum film is carried out by wet etching. The wiring can have a tapered shape in section by utilizing the characteristics of isotropic etching by wet etching, and thus, the connecting portion between the GMR element and the aluminum film can have a shape that is advantageous in terms of strength.

Figure 44:
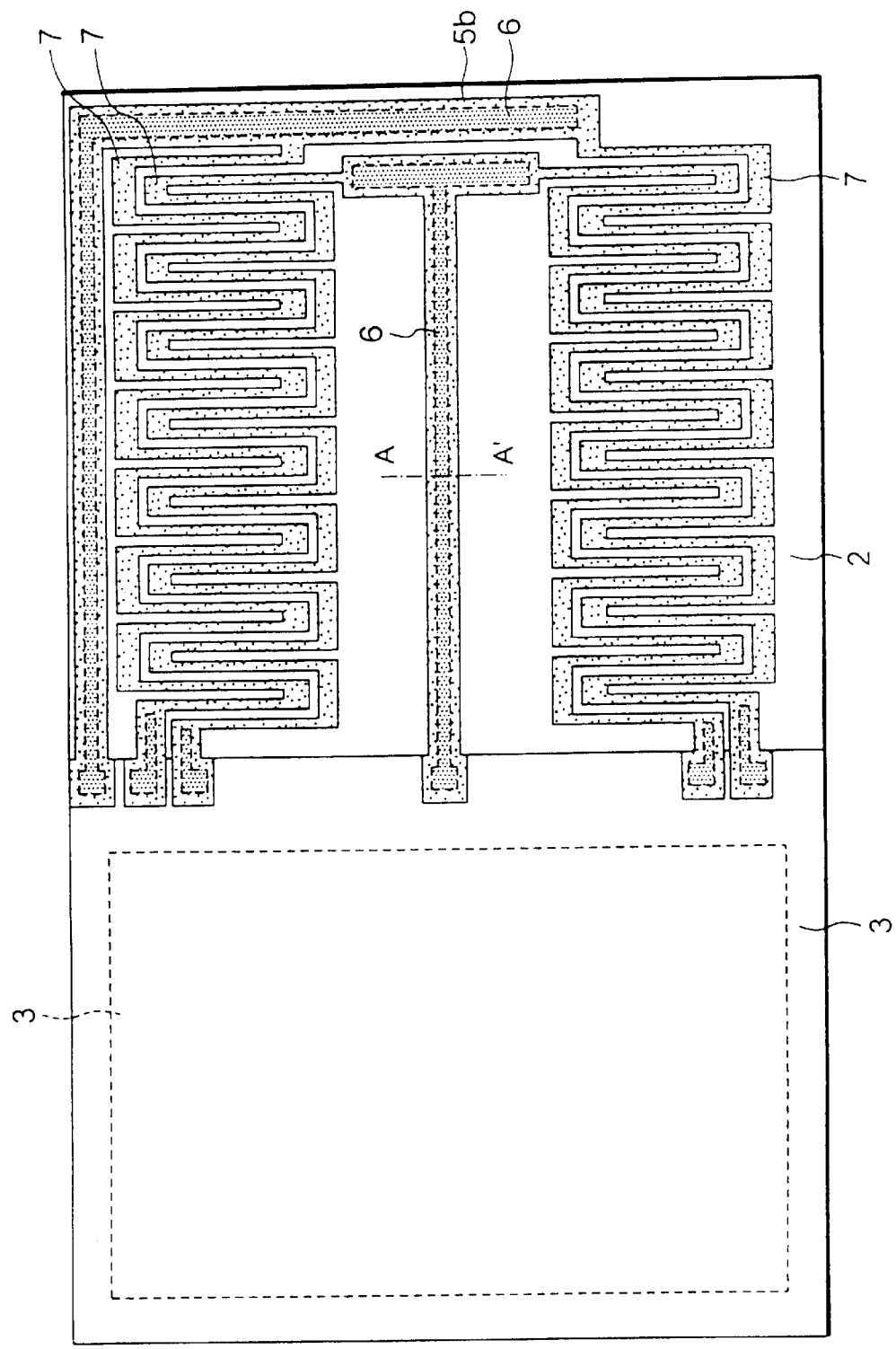
FIG. 44 is a top view transparently showing the structure of the magnetic field sensing element according to Embodiment 1.

FIG. 44 is a top view transparently showing the structure of the magnetic field sensing element according to Embodiment 1.

A GMR element 7 shown in FIG. 44 is represented, in a manner unlike the representation way of the GMR element 7 in FIG. 1, by more thick lines. However, these two figures show the GMR elements having the same structure.

Figure 45:
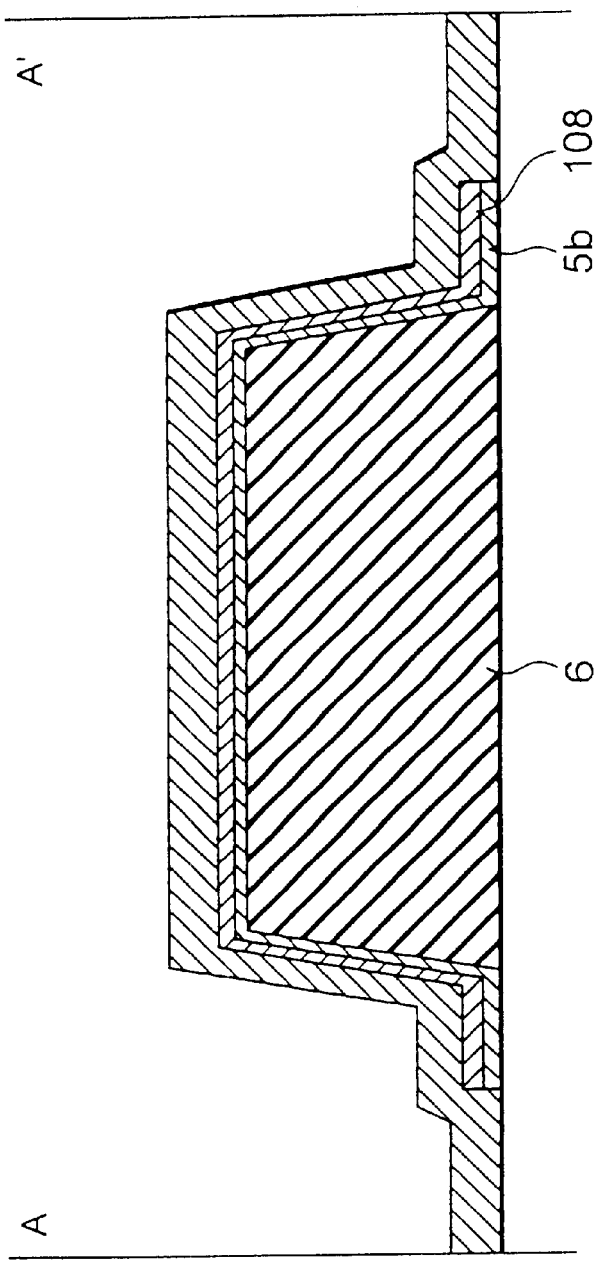
FIG. 45 is a sectional view showing the structure of the magnetic field sensing element cut along line A–A' in FIG. 44.

FIG. 45 is a sectional view showing the structure of the magnetic field sensing element cut along line A–A' in FIG. 44.

As shown in FIGS. 44 and 45, in Embodiment 1 of the present invention, a GMR element film 5b may be formed on the metal wiring 6. Incidentally, FIG. 45 shows a state in which protective films 108 and 109 are further formed on the GMR element film 5b.

In this way, when the GMR element film 5b is patterned to be formed on the metal wiring 6, electrical connection between the metal wiring 6 and the GMR element film 5b can be ensured.

Though it is preferable in this case that all of the top surface and the side surface of the metal wiring 6 are coated with the GMR element film 5b, sufficient effect would be obtained if coating more than about half of the top surface and the side surface of the metal wiring 6 are coated.

FIGS. 7 to 10 are conceptual views showing the manufacturing process of the magnetic field sensing element according to Embodiment 1 of the present invention.

Figure 7:
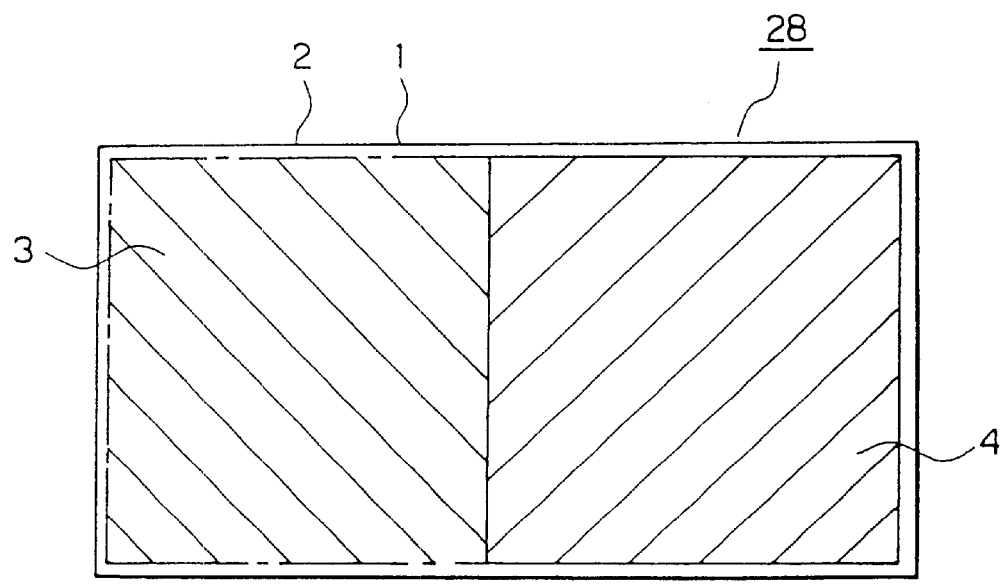
FIG. 7 is a conceptual view showing the manufacturing process of the magnetic field sensing element according to Embodiment 1 of the present invention.

First, as shown in FIG. 7, in the process of forming the integrated circuit of the magnetic field sensing element 28, a metal film 4, such as an aluminum film, is formed on the surface of the underlayer 2 of an Si thermal oxide film or the like formed on the substrate 1, for example, an Si substrate. Then, when the integrated circuit 3 is formed, a portion of the metal film 4 without the integrated circuit formed thereon (the right half on the substrate 1) remains unpatterned.

Figure 8:
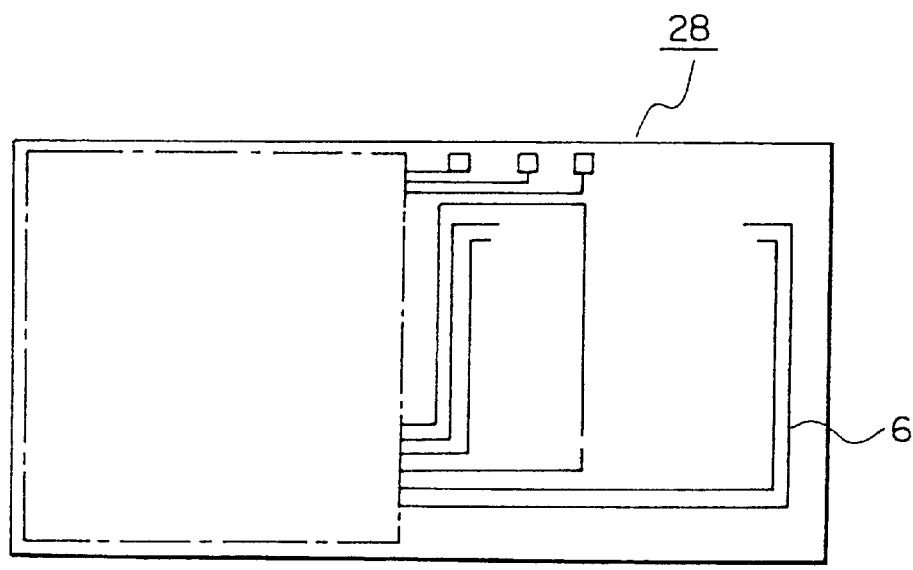
FIG. 8 is a conceptual view showing the manufacturing process of the magnetic field sensing element according to Embodiment 1 of the present invention.

Then, as shown in FIG. 8, the metal film 4 is patterned into predetermined metal wiring 6 utilizing photolithographic transfer.

Figure 9:
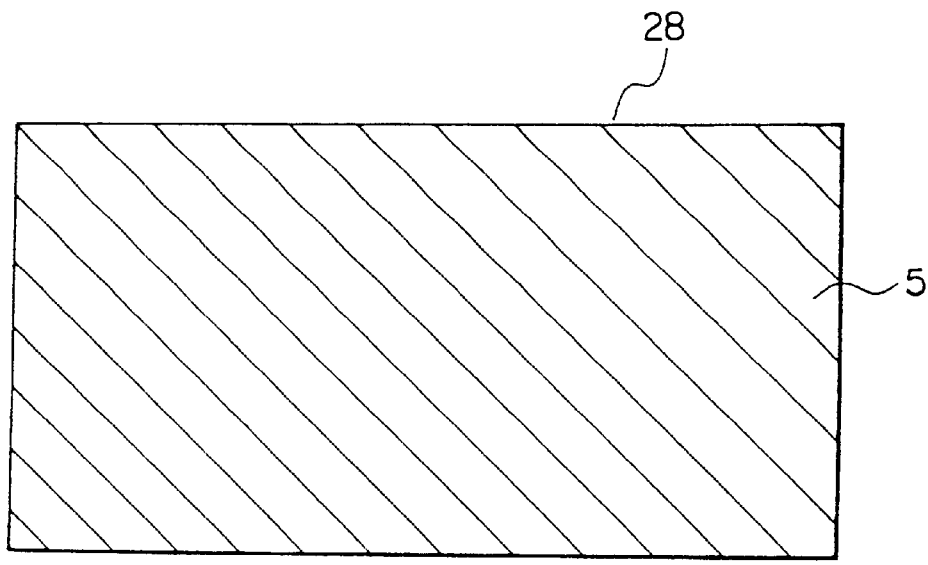
FIG. 9 is a conceptual view showing the manufacturing process of the magnetic field sensing element according to Embodiment 1 of the present invention.
Figure 10:
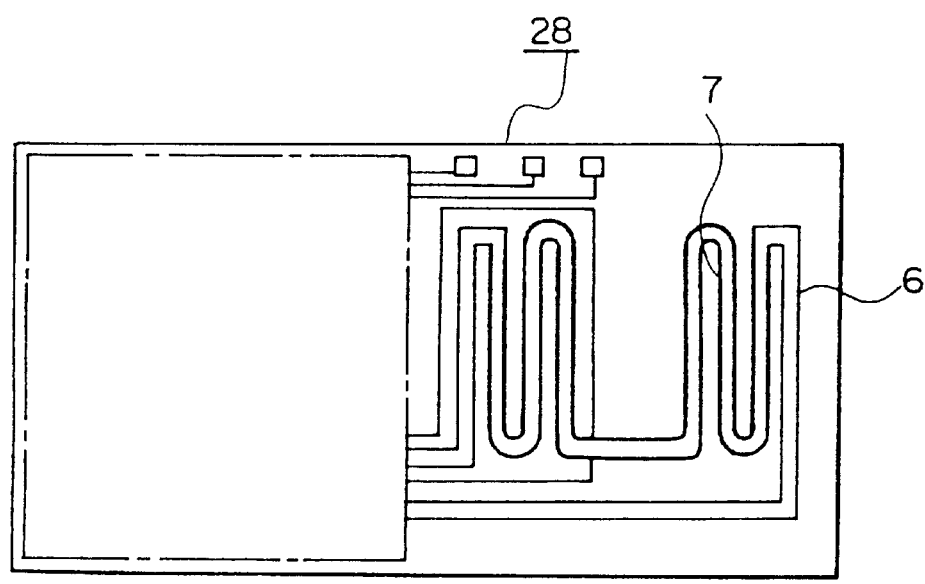
FIG. 10 is a conceptual view showing the manufacturing process of the magnetic field sensing element according to Embodiment 1 of the present invention.

Thereafter, as shown in FIG. 9, a GMR element film 5 is formed on the entire surface, and, as shown in FIG. 10, the GMR element 7 is patterned utilizing the photolithographic transfer.

In this way, in Embodiment 1, the GMR element 7 is formed on the underlayer 2 formed on the substrate 1, and further, a portion of the metal film 4 for forming the integrated circuit 3 is used as the metal wiring 6 for electrically connecting the integrated circuit 3 with the GMR element 7. Therefore, unlike the conventional case, it is not necessary to electrically connect a GMR element formed on a film surface and an integrated circuit formed on another film surface, and it is not necessary to newly form a metal film for forming the wiring. Accordingly, higher productivity and lower cost of a magnetic field sensing element 28 and a magnetic field sensing device using the magnetic field sensing element can be attained.

Further, since mean surface roughness of the underlayer 2 on which the GMR element 7 is formed, is made to be 50 Å or less, and preferably, between 1 Å and 25 Å, the characteristics of the GMR element 7 can be improved, and a highly accurate magnetic field sensing element can be provided.

Further, since the metal film 4 at the connecting portion between the metal wiring 6 and the GMR element 7 can be made with a tapered shape in section by using wet etching to carry out the patterning process for forming the metal wiring 6 from the metal film 4, breakage at the connecting portion is considerably inhibited, and thus, the reliability of the magnetic field sensing element 28 and a magnetic field sensing device using the magnetic field sensing element 28 can be improved.

Embodiment 2

In Embodiment 1, the metal wiring 6 can be satisfactorily connected with the GMR element 7 by forming the GMR element film 5 as a giant magnetoresistance element on the patterned metal film (i.e., the metal wiring 6 shown in FIG. 10) and on the underlayer 2 (see FIGS. 8 and 9) and patterning the GMR element film 5.

However, the thickness of the GMR element 7 is about 500 Å–2000, which is relatively thinner than the metal film 4 forming the metal wiring 6, and thus, if the metal film 4 is sufficiently thicker than the GMR element 7, the connection at the connecting portion between the metal wiring 6 and the GMR element 7 may become unstable. This is because the GMR element 7, which is thinner than the metal film 4 forming the metal wiring 6, may break due to a large difference in their levels at the connecting portion.

Figure 11:
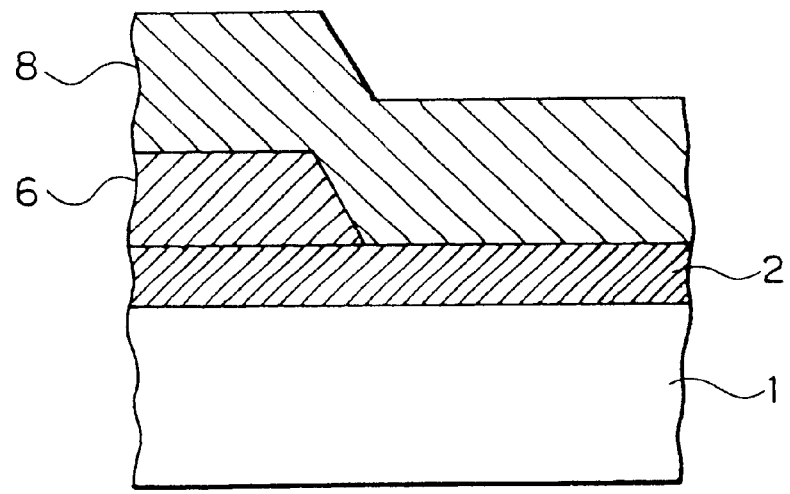
FIG. 11 is a partial sectional view of a magnetic field sensing element according to Embodiment 2 of the present invention.
Figure 12:
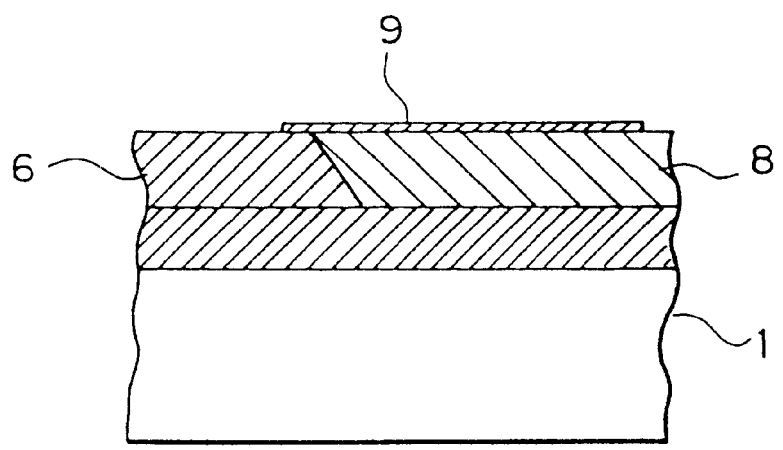
FIG. 12 is a partial sectional view of the magnetic field sensing element according to Embodiment 2 of the present invention.

In this case, a sufficient connection can be obtained by making the respective surfaces on which the metal wiring 6 and the GMR element 7 are formed substantially the same height. A description of such method will be made below. FIGS. 11 and 12 are partially sectional views of a magnetic field sensing element according to Embodiment 2 of the present invention.

Suppose that, for instance, the thickness of the metal film 4 is 1 µm. As shown in FIG. 11, an Si oxide film 8 with a thickness of 1.5 µm is formed, as a first level difference buffer layer, on the metal wiring 6, formed by patterning the metal film 4, and on the underlayer 2.

Then, the surface of the Si oxide film 8 is polished with ultrafine particles, diamond particles and the like. When the thickness to be polished away is a little more than 1.5 µm, the difference in the levels between the surface of the Si oxide film 8 and the surface of the metal film 4 for forming the metal wiring 6 can be made sufficiently smaller than the film thickness of the GMR element 7, and thus, as can be seen from the sectional view after polishing in FIG. 12, the surfaces of the metal wiring 6 and the Si oxide film 8 can be made flush.

If the GMR element 9 is formed on the metal wiring 6 and the Si oxide film 8 after making their surfaces flush in the above way, there is no difference in the level between the metal wiring 6 and the GMR element 9 at the connecting portion, and thus, the connection state can be improved. It is to be noted that, since the abrasive grains used for polishing the Si oxide film 8 are sufficiently fine, the surface after polishing is sufficiently smooth and satisfactory GMR element characteristics can be obtained.

Above description, a case is described where the Si oxide film 8 is used. However,when an insulating layer of tantalum oxide, silicon nitride, or the like is used, the same effect as above description can be obtained.

Embodiment 3

Figure 13:
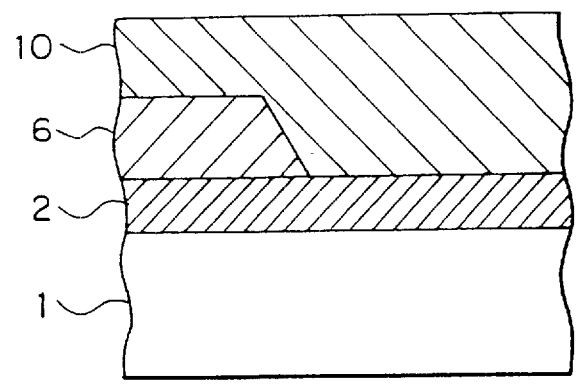
FIG. 13 is a sectional view conceptually showing the manufacturing process of a magnetic field sensing element according to Embodiment 3 of the present invention.
Figure 14:
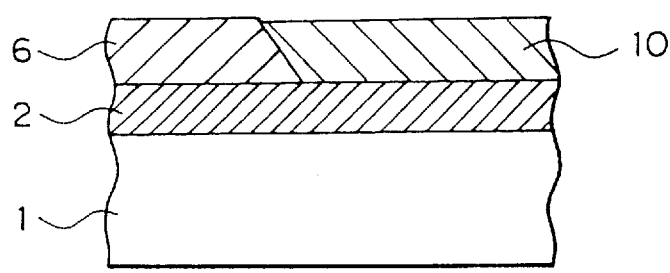
FIG. 14 is a sectional view conceptually showing the manufacturing process of the magnetic field sensing element according to Embodiment 3 of the present invention.

FIGS. 13 and 14 are sectional views conceptually showing the manufacturing process of a magnetic field sensing element according to Embodiment 3 of the present invention.

Figure 15:
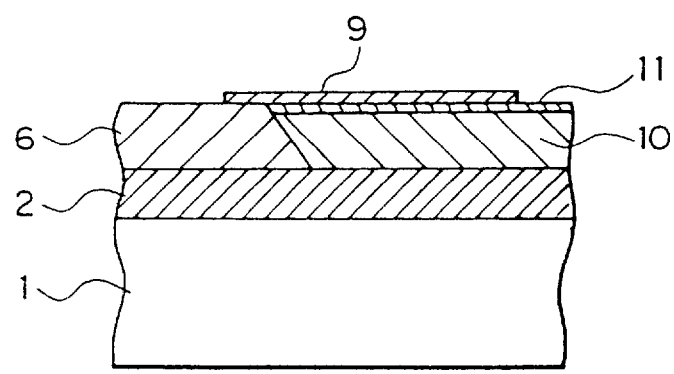
FIG. 15 is a sectional view conceptually showing the magnetic field sensing element according to Embodiment 3 of the present invention.

FIG. 15 is a sectional view conceptually showing the magnetic field sensing element according to Embodiment 3 of the present invention.

In Embodiment 3, by applying a resist or a resin layer of polyimide, PVSQ (silicon ladder polymer), or the like as a first level difference buffer layer by spin coating, the surface on which the surface on which the wiring is formed and the surface on which the GMR element is formed are made flush.

For example, similar to Embodiment 2, when, a resist 10 with a thickness of 2 µm is applied onto the entire surface by spin coating after the metal film with a thickness of 1 µm has been patterned to form the metal wiring 6, the surface of the resist 10 becomes flat without a level difference as shown in FIG. 13.

Then, the surface of the resist 10 is removed by resist ashing and the like to evenly thin the resist 10. By removing the resist 10 until the upper surface of the metal wiring. 6 appears, the difference of the level between the surface of the resist 10 and the surface of the metal film 4 for forming the metal wiring 6 can be made sufficiently smaller than the film thickness of the GMR element 9 as shown in FIG. 14, and the upper surface of the metal wiring 6 with the surface on which the GMR element 9 is formed can thereby be made substantially flush in section after the resist ashing.

A thin film such as an Si oxide film with a thickness of 1,000 Å, for instance, is formed on the entire upper surface of the above formed metal wiring 6 and the resist 10, and the thin film formed on the metal wiring 6 is removed by photolithography and RIE (reactive ion etching) to leave only an Si oxide film 11 on the resist 10 and expose the metal wiring 6 (see FIG. 15).

The rest of the process forming the GMR element 9 comprises similar to Embodiment 2, as shown in FIG. 15.

In the above description, resist ashing is used as the method of thinning the resist 10. However, RIE (reactive ion etching), IBE (ion beam etching), wet etching using an etchant or the like can remove the resist in a way similar to above case.

Further, since the resist is easily effected by a solvent or the like, the Si oxide film 11 with a thickness of 1,000 Å is formed on the resist 10 before the GMR element 9 is formed, to prevent the resist 10 from being removed when the GMR element 9 is patterned.

It is to be noted that, if a solvent that is not capable of dissolving the resist layer is used in the process of patterning the GMR element 9, the above mentioned Si oxide film need not be formed.

Embodiment 4

Figure 16:
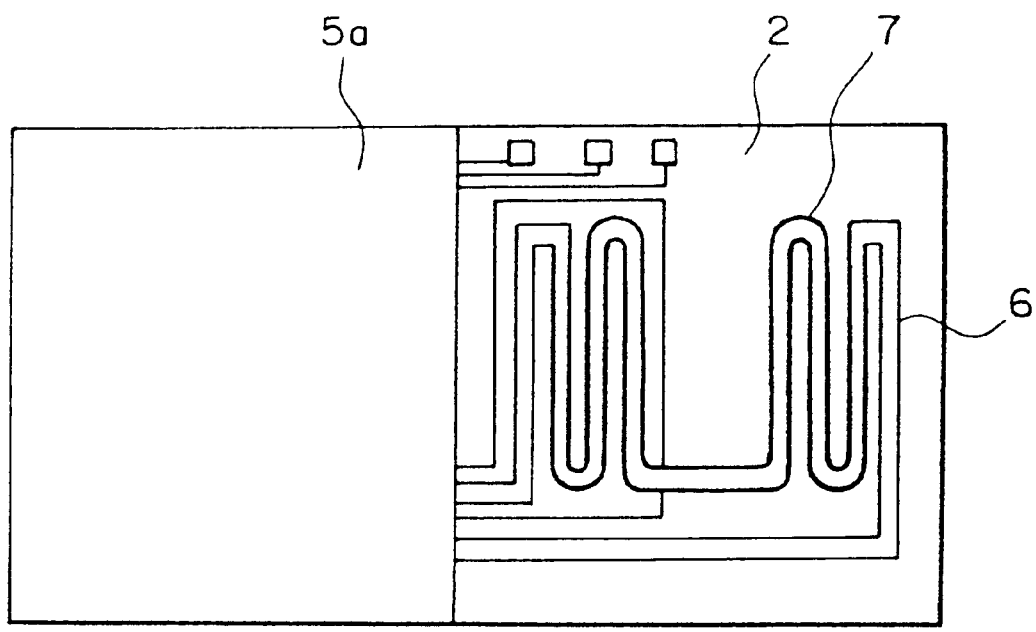
FIG. 16 shows an essential portion of a magnetic field sensing element according to Embodiment 4 of the present invention.

FIG. 16 shows an essential portion of a magnetic field sensing element according to Embodiment 4 of the present invention.

In Embodiment 4, after the GMR element film 5 as a giant magnetoresistance element is formed on the entire upper surface of the underlayer 2 and the metal wiring 6, a GMR element film 5a formed on the integrated circuit is left unremoved and the GMR element 7 is patterned.

This type of patterning of the GMR element 7 is generally carried out by IBE. Accordingly, if, as in Embodiment 1, only the portion to be used as the GMR element 7 is left and the patterning is carried out, and the other portions are removed, ion collisions may damage the integrated circuit. However, in Embodiment 4, since the GMR element on the integrated circuit is not removed when the GMR element 7 is patterned, the integrated circuit can be protected from damage due to ion collisions. As a result, the reliability of the magnetic field sensing element can be improved.

Embodiment 5

Figure 17:
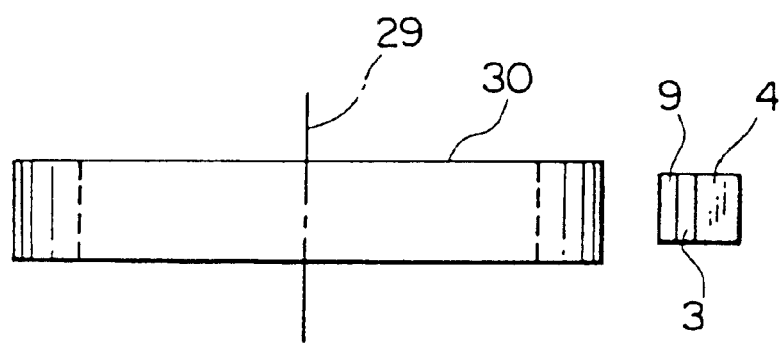
FIG. 17 is a side view showing the structure of a magnetic field sensing device according to Embodiment 5 of the present invention.
Figure 18:
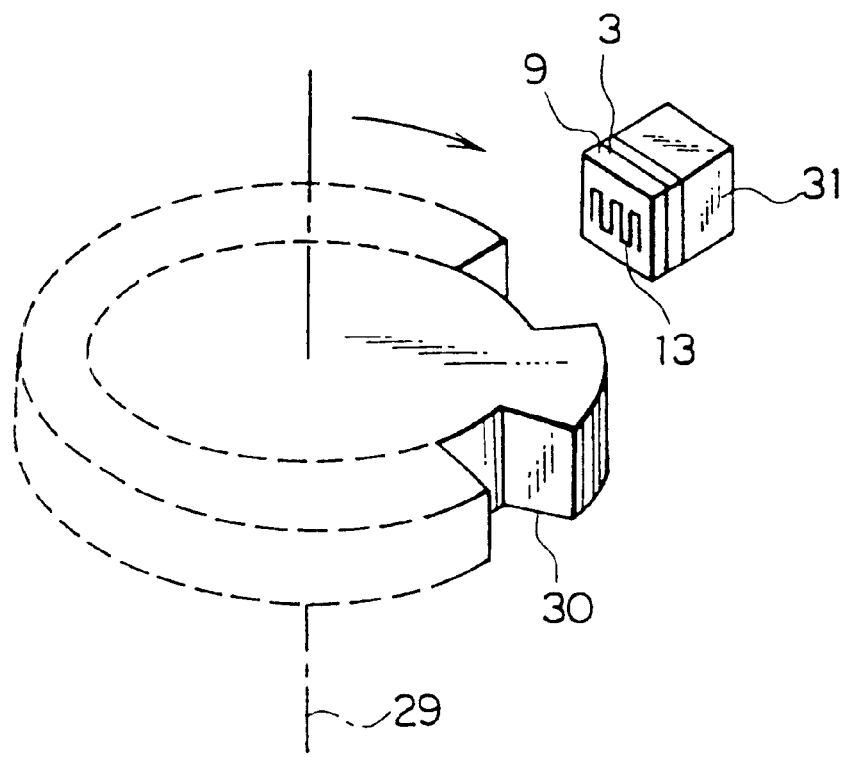
FIG. 18 is a perspective view showing the structure of the magnetic field sensing device according to Embodiment 5 of the present invention.

FIGS. 17 and 18 are a side view and a perspective view, respectively, showing the structure of a magnetic field sensing device according to Embodiment 5 of the present invention.

In Embodiment 5, as shown in FIGS. 17 and 18, the GMR element 9 as a giant magnetoresistance element is formed on the integrated circuit 3.

Figure 19:
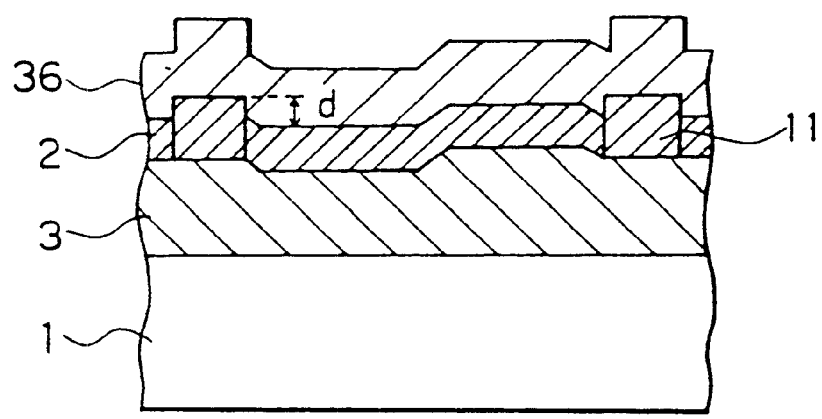
FIG. 19 is a conceptual view showing the structure in section during a manufacturing process of the magnetic field sensing element according to Embodiment 5 of the present invention.
Figure 20:
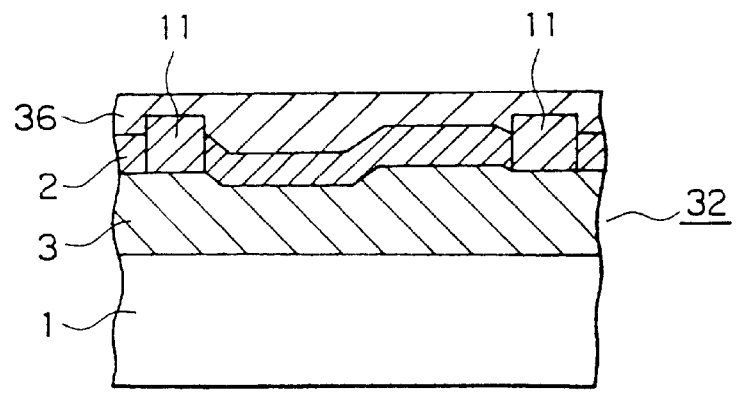
FIG. 20 is a conceptual view showing the structure in section during a manufacturing process of the magnetic field sensing element according to Embodiment 5 of the present invention.
Figure 21:
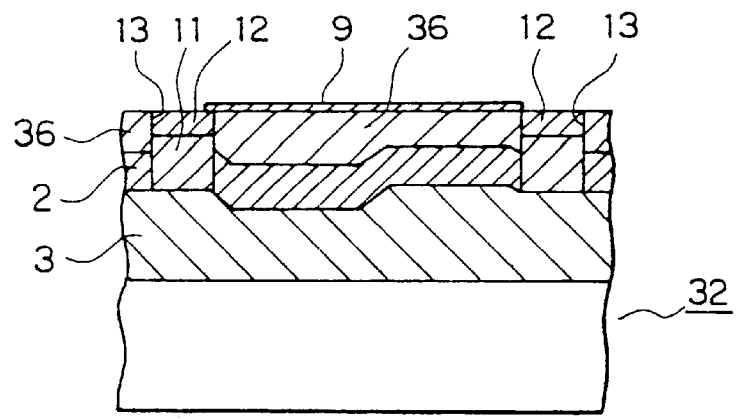
FIG. 21 is a conceptual view showing the structure in section during a manufacturing process of the magnetic field sensing element according to Embodiment 5 of the present invention.

FIGS. 19, 20, and 21 are conceptual views showing the structure in section during a manufacturing process of a magnetic field sensing element used in the magnetic field sensing device according to Embodiment 5 of the present invention.

As shown in FIG. 19, the integrated circuit 3, metal pads 11, and the underlayer 2 are formed on the substrate 1 by photolithographic transfer and RIE. Further, an Si oxide film 36 as a second level difference buffer layer is formed on the entire exposed upper surfaces of the metal pads 11 and the upper surface of the underlayer 2.

The Si oxide film 36 must be formed thicker than the maximum level difference d between the surfaces of the underlayer 2 and the surface of the metal pads 11 (see arrows in FIG. 19). For example, the Si oxide film 36 is about twice as thick as the maximum level difference d. The surface of the Si oxide film 36 is polished smooth in a way similar to Embodiment 2.

Here, the thickness of the Si oxide film 36 to be polished away is a little less than the maximum level difference d of the integrated circuit 3.

It is to be noted that, though FIGS. 19 to 21 show a portion where the metal pads 11 are formed directly on the integrated circuit 3, there is also a portion where the metal pads 11 are formed on the underlayer 2 which is an insulating layer, thus insulating the metal pads 11 and the integrated circuit 3.

After polishing is carried out as shown in FIG. 20, only the Si oxide film 36 on the metal pads 11 is removed by photolithographic transfer and RIE to form holes 13 above the metal pads 11 (FIG. 21 shows a state where the holes 13 are filled with a metal film 12). Then, the metal film 12 is formed in the holes 13 and on the entire upper surface of the Si oxide film 36. The thickness of the metal film 12 is a little more than the depth of the holes 13.

Further, after photolithographic transfer is conducted, by etching the metal film 12, only the metal film 12 formed on the Si oxide film 36 is removed to leave the metal film 12 only inside the holes 13, and the holes 13.

Here, the level difference which existed between the surface of the underlayer 2 and the surface of the metal pads 11 (see FIG. 19) does not exist on the Si oxide film 36, and thus, the Si oxide film 36 having a surface that is sufficiently smooth for forming the GMR element 9 thereon can be formed.

Then, as shown in FIG. 21, when the GMR element 9 is formed so as to be connected with the metal film 12 embedded in the holes 13, not only can the GMR element 9 be formed above the integrated circuit 3, but the integrated circuit 3 can also be electrically connected with the GMR element 9.

Since this makes it possible to reduce the area of the substrate 1, not only can the cost be lowered, but also a magnetic field sensing element 32 and a magnetic field sensing device using the magnetic field sensing element 32 can be miniaturized.

It is to be noted that since there is generally a level difference on the surface of the integrated circuit 3 and the GMR element 9 is strongly affected by even a subtle level difference on the surface of the underlayer 2, this level difference is eliminated before the GMR element 9 is formed.

Embodiment 6

Figure 22:
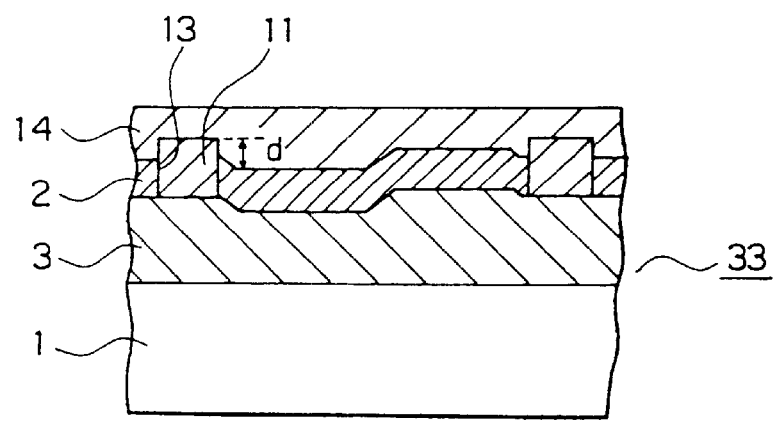
FIG. 22 is a conceptual view showing the structure in section of a magnetic field sensing element according to Embodiment 6 of the present invention.
Figure 23:
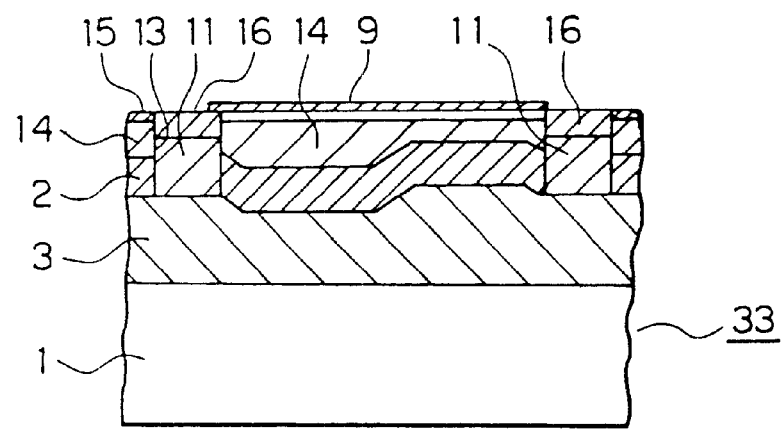
FIG. 23 is a conceptual view showing the structure in section of the magnetic field sensing element according to Embodiment 6 of the present invention.

FIGS. 22 and 23 conceptually show the structure in section of a magnetic field sensing element according to Embodiment 6 of the present invention.

In Embodiment 6, instead of the Si oxide film used in Embodiment 5, resist is used as a second level difference buffer layer to form a magnetic field sensing element.

As shown in FIG. 22, after the integrated circuit 3 is formed on the substrate 1, the metal pads 11 for electrically connecting with the integrated circuit 3 are formed, and resist 14 as the second level difference buffer layer is applied by spin coating to the exposed surfaces of the metal pads 11 and the entire surface of the underlayer 2. The thickness of the applied resist 14 is more than the maximum level difference d between the surface of the underlayer 2 and the surface of the metal pads 11. Here, for example, the resist 14 is formed so as to be about twice as thick as the maximum level difference d of the surface of the integrated circuit 3.

As shown in FIG. 22, the surface of the resist 14 as the second buffer layer is smooth. Further, an Si oxide film 15 with a thickness of, for example, 1,000 Å is formed on the resist 14.

It is to be noted that, although the Si oxide film 15 is used here, a film of some other appropriate material may be used.

Next, the Si oxide film 15 and the resist 14 on the metal pads 11 are removed to form the holes 13 above the metal pads 11 by photolithographic transfer, RIE, and resist ashing.

Since the resist 14 is easily dissolved in etchant used for forming the holes 13, the Si oxide film 15 is formed on the resist 14 to prevent the resist, except the portions for forming the holes 13 therein, from being dissolved in the etching process. Therefore, if a solvent that does not dissolve the resist 14 is used in the etching process, the Si oxide film 8 need not be formed.

Then, a metal film 16 is formed in the holes 13 and on the entire surface of the Si oxide film 15. The thickness of the metal film 16 is a little more than the depth of the holes 13 (this state is not shown).

Further, the metal film 16 except the portions above the metal pads 11 is removed by photolithographic transfer and by etching.

As a result, as shown in FIG. 23, the holes 13 above the metal pads 11 can be filled with the metal film 16.

The level difference which existed on the surface of the integrated circuit 3 has been eliminated, and thus, a surface which is smooth enough for forming the GMR element 9 thereon can be obtained.

As shown in FIG. 23, the GMR element 9 can be formed over the integrated circuit 3 by forming the GMR element 9 on the Si oxide film 15 so as to be connected with the metal film 16 embedded in the resist 14 and the Si oxide film 15.

As a result, it possible to reduce the area of the substrate 1, and thus, not only can the cost be lowered, but a magnetic field sensing element 33 and a magnetic field sensing device using the magnetic field sensing element 33 can also be miniaturized.

Further, although a resist is used above description, a resin layer of polyimide, PVSQ, or the like may be applied by spin coating to obtain a similar effect.

Embodiment 7

Figure 24:
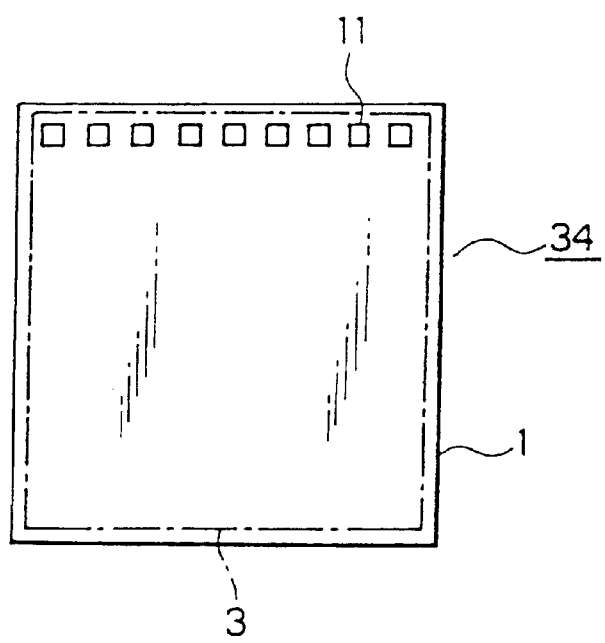
FIG. 24 shows the structure of the front surface of a magnetic field sensing element according to Embodiment 7 of the present invention.
Figure 25:
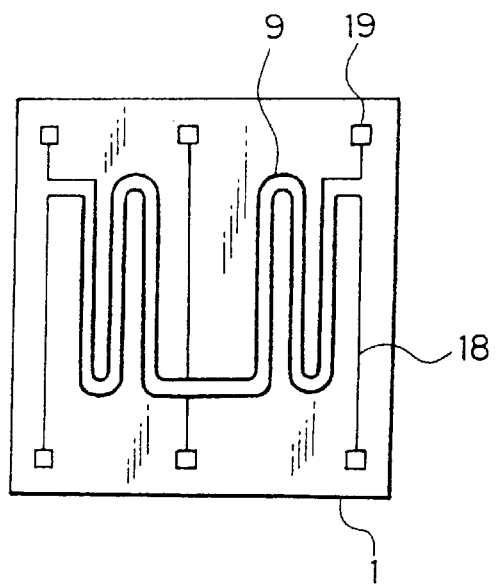
FIG. 25 shows the structure of the rear surface of the magnetic field sensing element according to Embodiment 7 of the present invention.

FIGS. 24 and 25 show the structure of the front surface and the back surface, respectively, of a magnetic field sensing element according to Embodiment 7 of the present invention.

Figure 26:
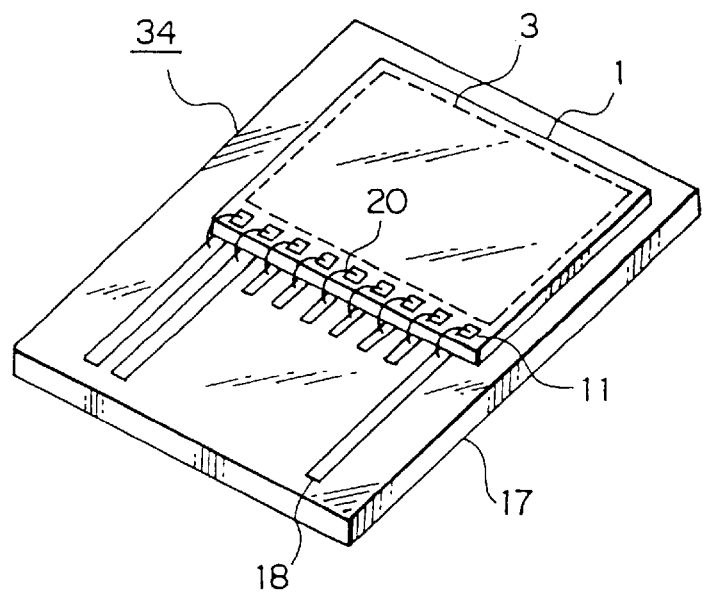
FIG. 26 is a perspective view of the magnetic field sensing element according to Embodiment 7 of the present invention.
Figure 27:
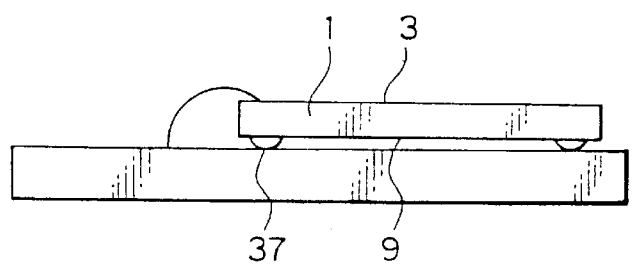
FIG. 27 is a side view of the magnetic field sensing element according to Embodiment 7 of the present invention.

FIGS. 26 and 27 are a perspective view and a side view, respectively, of the magnetic field sensing element according to Embodiment 7 of the present invention.

In Embodiment 7, the GMR element 9 is formed on a different plane than the plane of the substrate where the integrated circuit is formed.

As shown in FIGS. 26 and 27, the substrate 1 on which the GMR element 9 is formed is arranged on a substrate 17 as a second substrate such that the surface where the GMR element 9 is formed is covered by the substrate 17.

In this case, wiring 18 arranged on the substrate 17 is electrically connected via solder 37 with metal pads 19 on the surface where the GMR element 9 of the substrate 1 is formed. Further, the metal pads 11 on the surface where the integrated circuit 3 of the substrate 1 are formed is electrically connected via wires 20 with the wiring 18 on the substrate 17.

In this way, in Embodiment 7, since the GMR element 9 is formed on a different surface than the surface of the substrate 1 on which the integrated circuit 3 is formed, and metal pads 19 for connection are further provided, the area of the substrate 1 can be reduced. Therefore, not only can a magnetic field sensing element 34 and a magnetic field sensing device using the magnetic field sensing element 34 be miniaturized, but the cost can also be lowered.

It is to be noted that, the substrate 1 is arranged so that the surface on which the GMR element 9 is formed is covered by the substrate 17. However, a similar effect can be obtained by arranging the substrate 1 so that the surface on which the integrated circuit 3 is formed is covered by the substrate 17.

Embodiment 8

Figure 28:
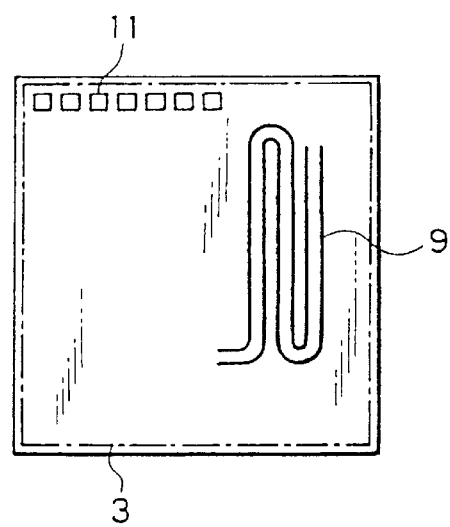
FIG. 28 shows the structure of the front surface of a magnetic field sensing element according to Embodiment 8 of the present invention.
Figure 29:
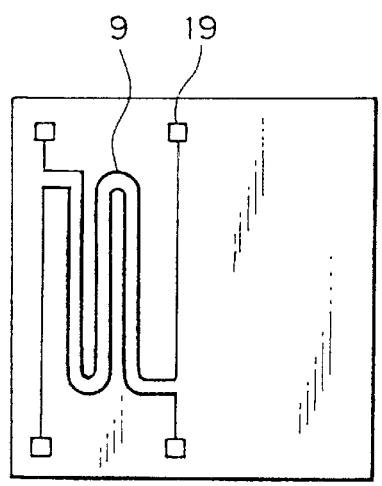
FIG. 29 shows the structure of the rear surface of the magnetic field sensing element according to Embodiment 8 of the present invention.

FIGS. 28 and 29 are a front view and a rear view, respectively, which show a magnetic field sensing element according to Embodiment 8 of the present invention.

Figure 30:
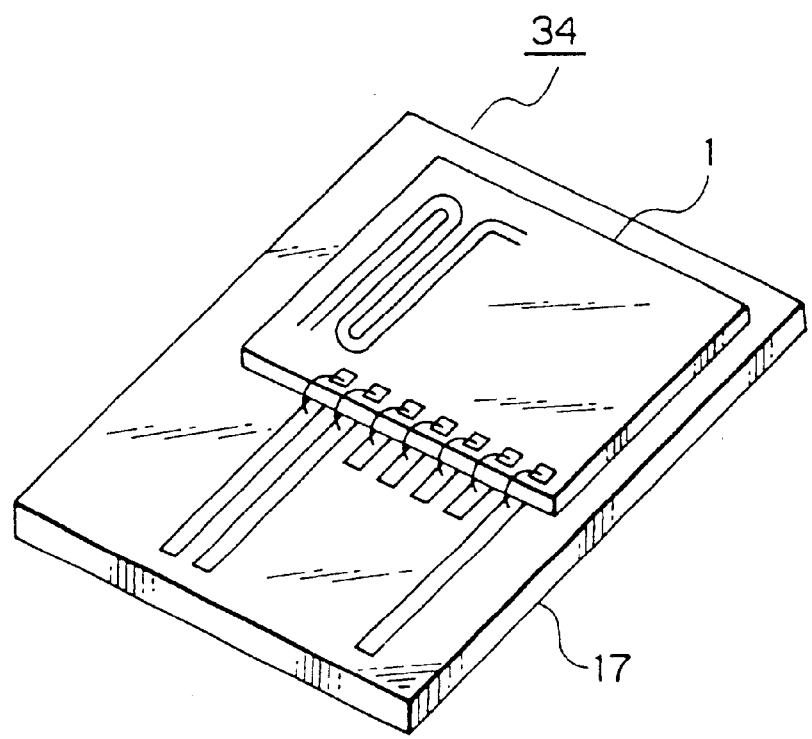
FIG. 30 is a perspective view of the magnetic field sensing element according to Embodiment 8 of the present invention.
Figure 31:
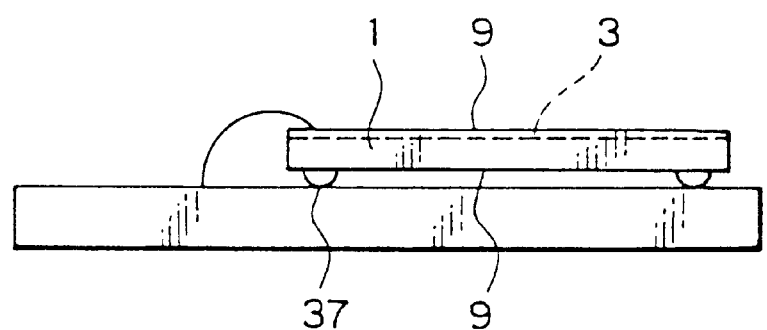
FIG. 31 is a side view of the magnetic field sensing element according to Embodiment 8 of the present invention.

FIGS. 30 and 31 are a perspective view and a side view of the magnetic field sensing element according to Embodiment 8 of the present invention.

In Embodiment 8, a GMR element 9 is formed on both surfaces of the substrate 1. More specifically, a GMR element 9 is formed on the integrated circuit 3 on the surface where the integrated circuit 3 is formed, similar to the case of Embodiment 5, and a GMR element 9 is also formed on the opposite surface. It is to be noted that the method of forming the GMR elements 9 and the like is similar to that in other embodiments.

In this way, if a GMR element 9 is formed on both surfaces of the substrate 1, a highly accurate magnetic field sensing element can be obtained. Further, there are also advantages in the area of the substrate can be reduced, a low-cost magnetic field sensing element can be obtained, and the magnetic field sensing element can be miniaturized.

Figure 32:
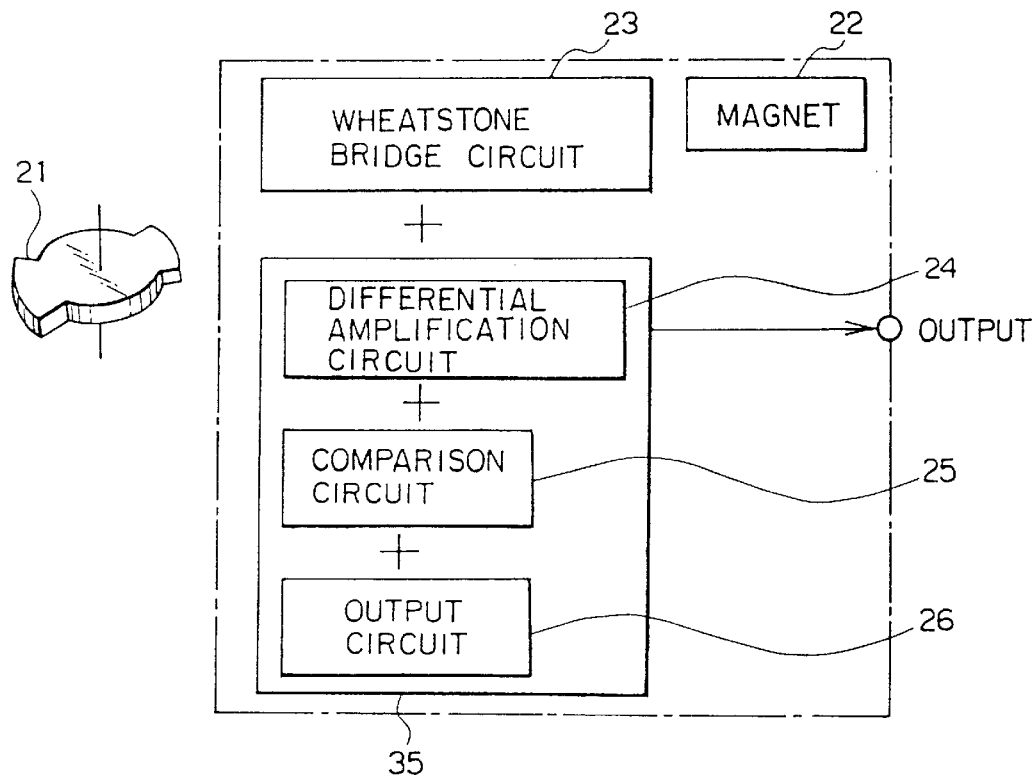
FIG. 32 is a block diagram conceptually showing the structure of a magnetic field sensing device according to Embodiment 8 of the present invention.

FIG. 32 is a block diagram conceptually showing the structure of a magnetic field sensing device according to Embodiment 8 of the present invention.

Figure 33:
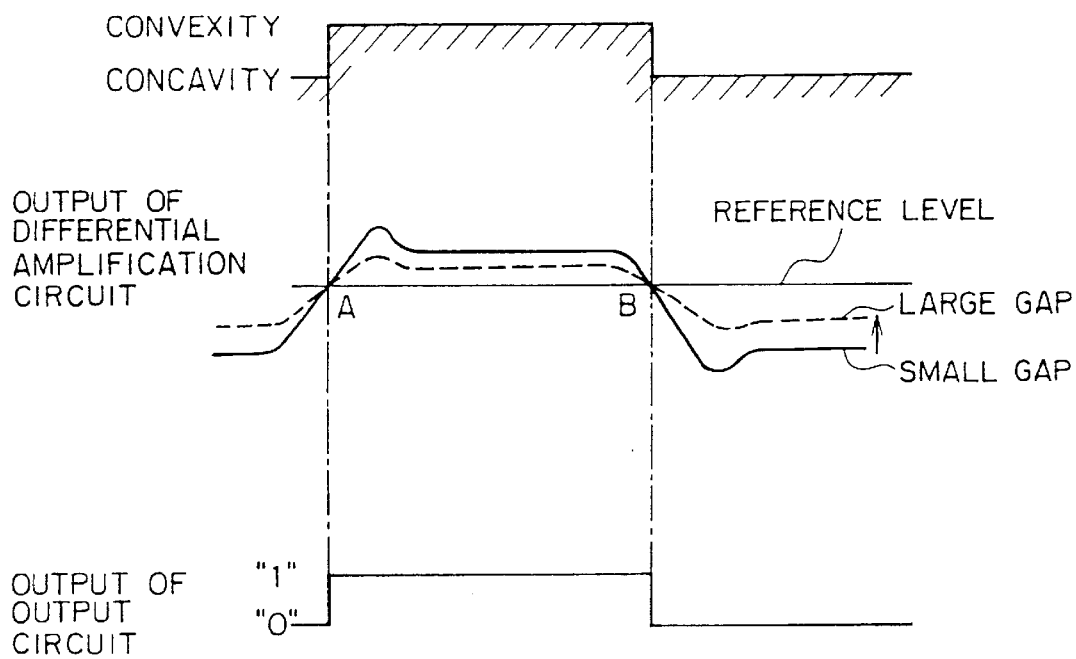
FIG. 33 is a graph showing operating characteristics of the magnetic field sensing element according to Embodiment 8 of the present invention.
Figure 34:
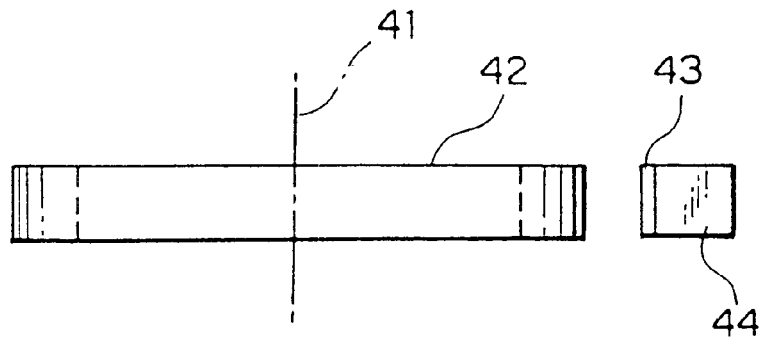
FIG. 34 is a side view showing the structure of a conventional magnetic field sensing device.
Figure 35:
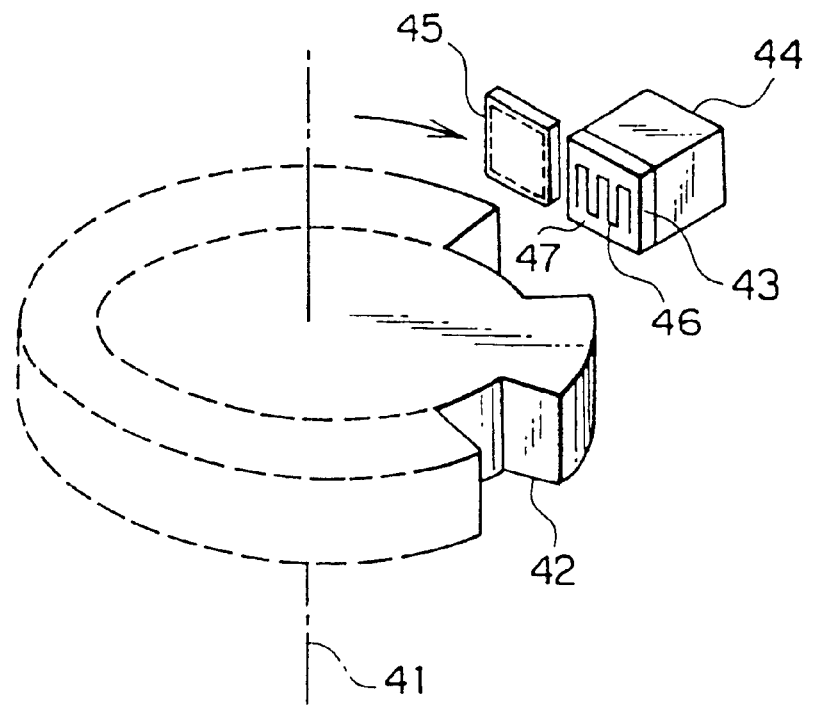
FIG. 35 is a perspective view showing the structure of the conventional magnetic field sensing device.
Figure 36:
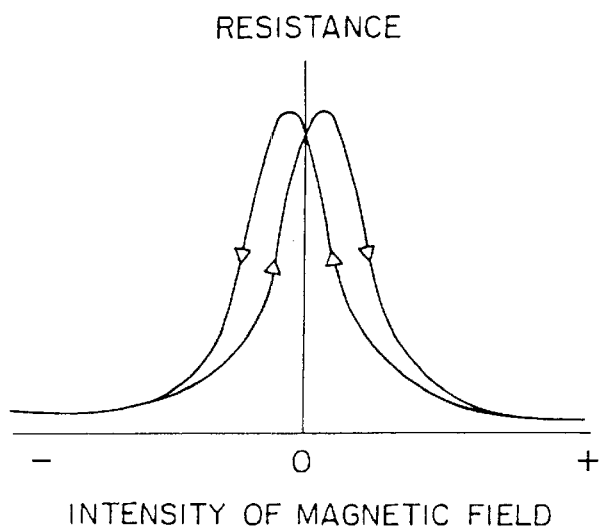
FIG. 36 is a graph showing the characteristics of a conventional GMR element.
Figure 37:
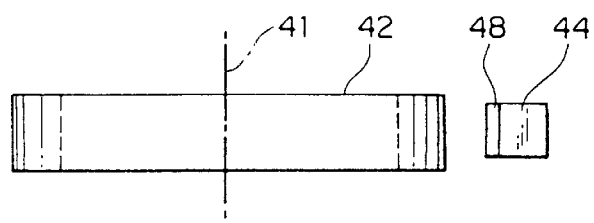
FIG. 37 is a side view showing the structure of a magnetic field sensing device using a conventional GMR element.
Figure 38:
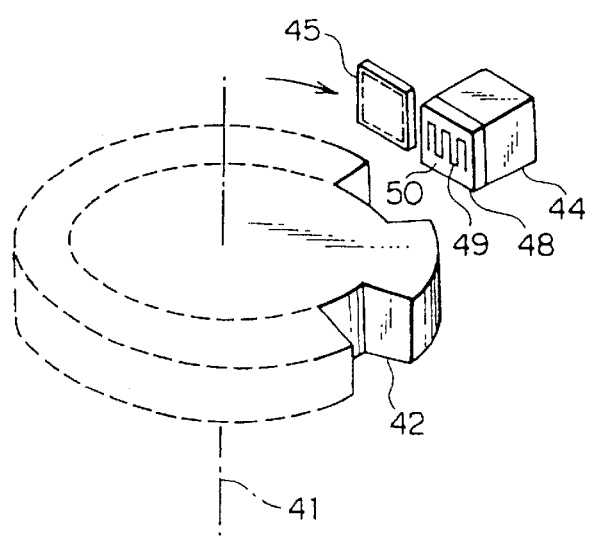
FIG. 38 is a perspective view showing the structure of the magnetic field sensing device using the conventional GMR element.
Figure 39:
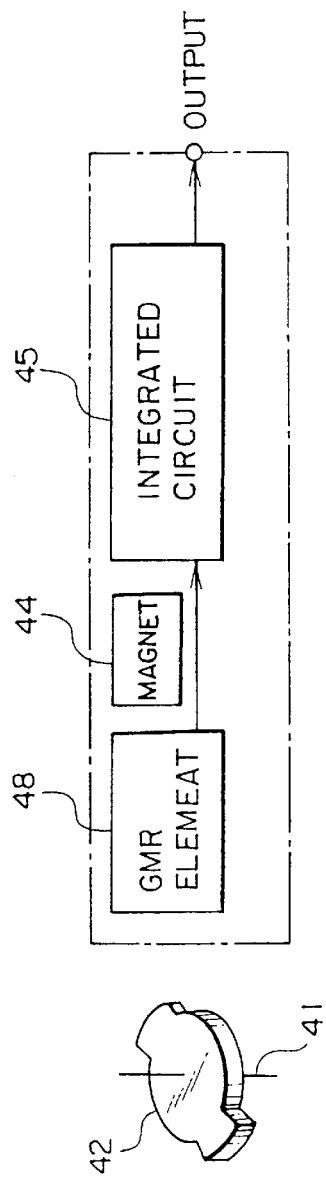
FIG. 39 is a block diagram showing the magnetic field sensing device using the conventional GMR element.
Figure 40:
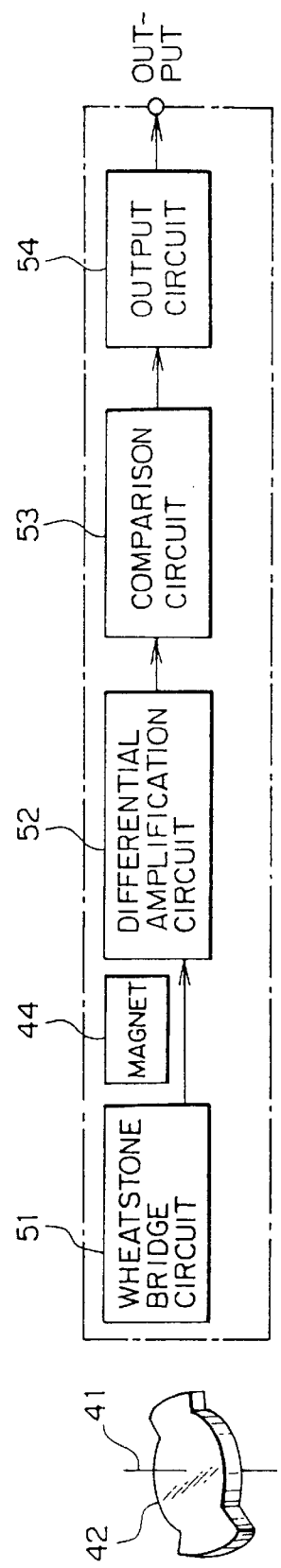
FIG. 40 is a block diagram showing the detail of the magnetic field sensing device using the conventional GMR element.

FIG. 33 is a graph showing operating characteristics of the magnetic field sensing element according to Embodiment 8 of the present invention.

As shown in FIG. 32, the magnetic field sensing device according to Embodiment 8 of the present invention is arranged with a predetermined gap between a magnetic rotating body 21, and comprises a Wheatstone bridge circuit 23 using the GMR element 9 to which a magnetic field is applied by a magnet 22, a differential amplification circuit 24 for amplifying the output of the Wheatstone bridge circuit 23, a comparison circuit 25 for comparing the output of the differential amplification circuit 24 with a reference value to output a signal of either "0" or "1," and an output circuit 26 for switching in response to the output of the comparison circuit 25.

Figure 41:
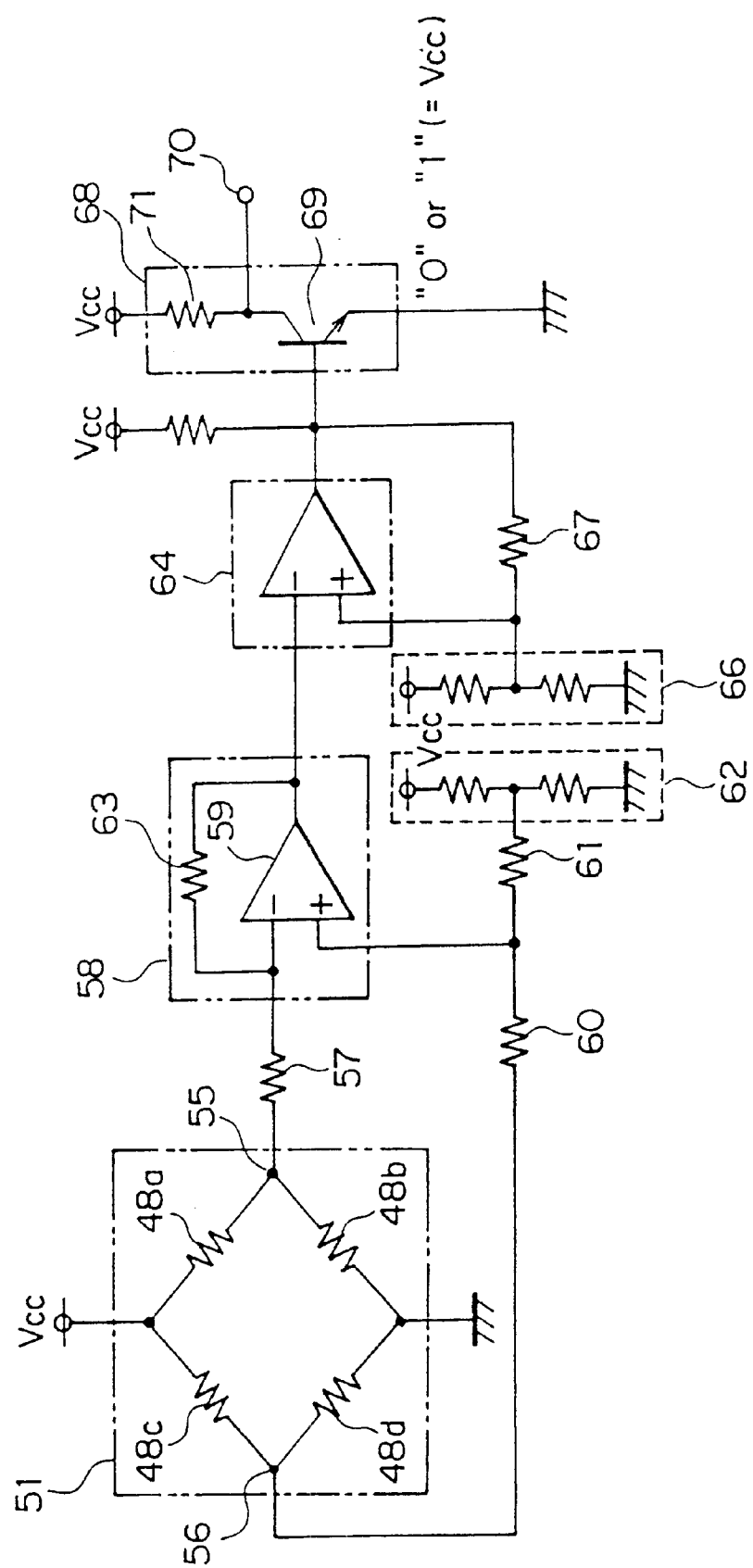
FIG. 41 shows an example of the structure of a circuit of the magnetic field sensing device using the conventional GMR element.
Figure 42:
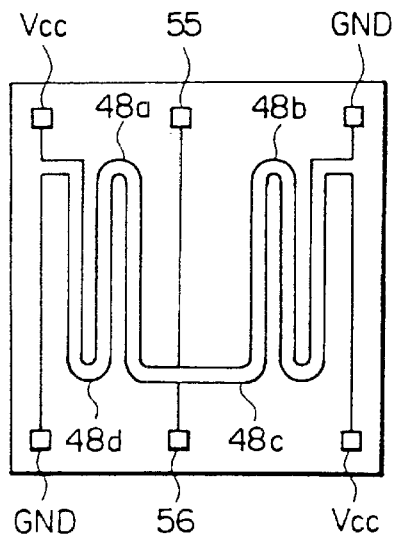
FIG. 42 shows the structure of the conventional magnetic field sensing element.
Figure 43:
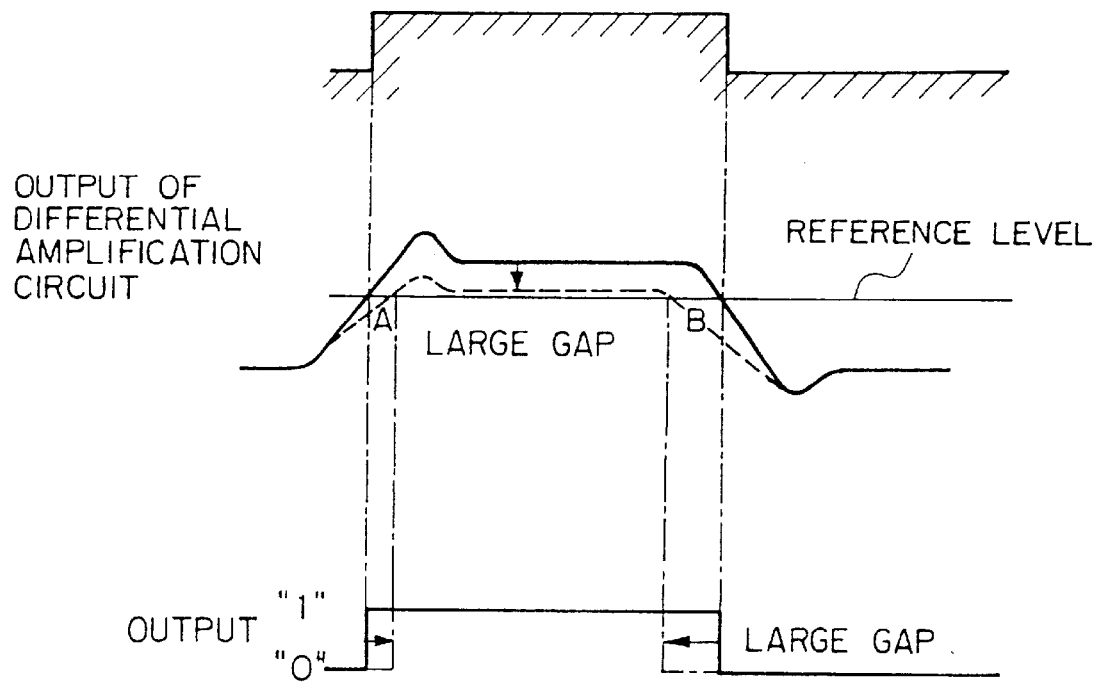
FIG. 43 is a graph showing operating characteristics of the conventional magnetic field sensing element.

Since the structure of the circuit of the Wheatstone bridge circuit 23 shown in FIG. 32 is similar to a conventional one (see FIG. 41), the description thereof is omitted.

In FIG. 32, rotation of the magnetic rotating body 21 causes a change in the magnetic field supplied to the GMR element 9 forming the Wheatstone bridge circuit 23. Then, as shown in FIG. 33, output corresponding to the concavities and the convexities of the magnetic rotating body 21 can be obtained at an output end of the differential amplification circuit 24.

Points A and B are output characteristics of the differential amplification circuit with respect to the change in the gap between the GMR element 9 and the magnetic rotating body 21, where the output of the differential amplifier is constant irrespective of the gap.

Therefore, by setting the reference value of the comparison circuit so as to pass the points A and B, the output of the comparison circuit can be changed at a predetermined position, irrespective of the gap amount, and thus, it is possible to make the gap characteristics satisfactory. Consequently, the amount of rotation of the magnetic rotating body 21 can be accurately ascertained.

As described above, in Embodiment 8, since the GMR element 9 is formed on a surface which is not the surface on which the integrated circuit 3 is formed, a highly accurate magnetic field sensing element 35 and a magnetic field sensing device using the magnetic field sensing element 35 can be obtained. Further, since the area of the substrate can be reduced, the cost of the magnetic field sensing element can be lowered. Further, by reducing the area of the substrate, the magnetic field sensing element can be miniaturized.

It is to be noted that, although the structure where the GMR element 9 is formed on the lower surface has been described, a similar effect can be obtained by forming the integrated circuit on the lower surface.

Embodiment 9

FIGS. 46 to 50 are views showing the structure of a magnetic filed sensing element according to Embodiment 9.

Figure 46:
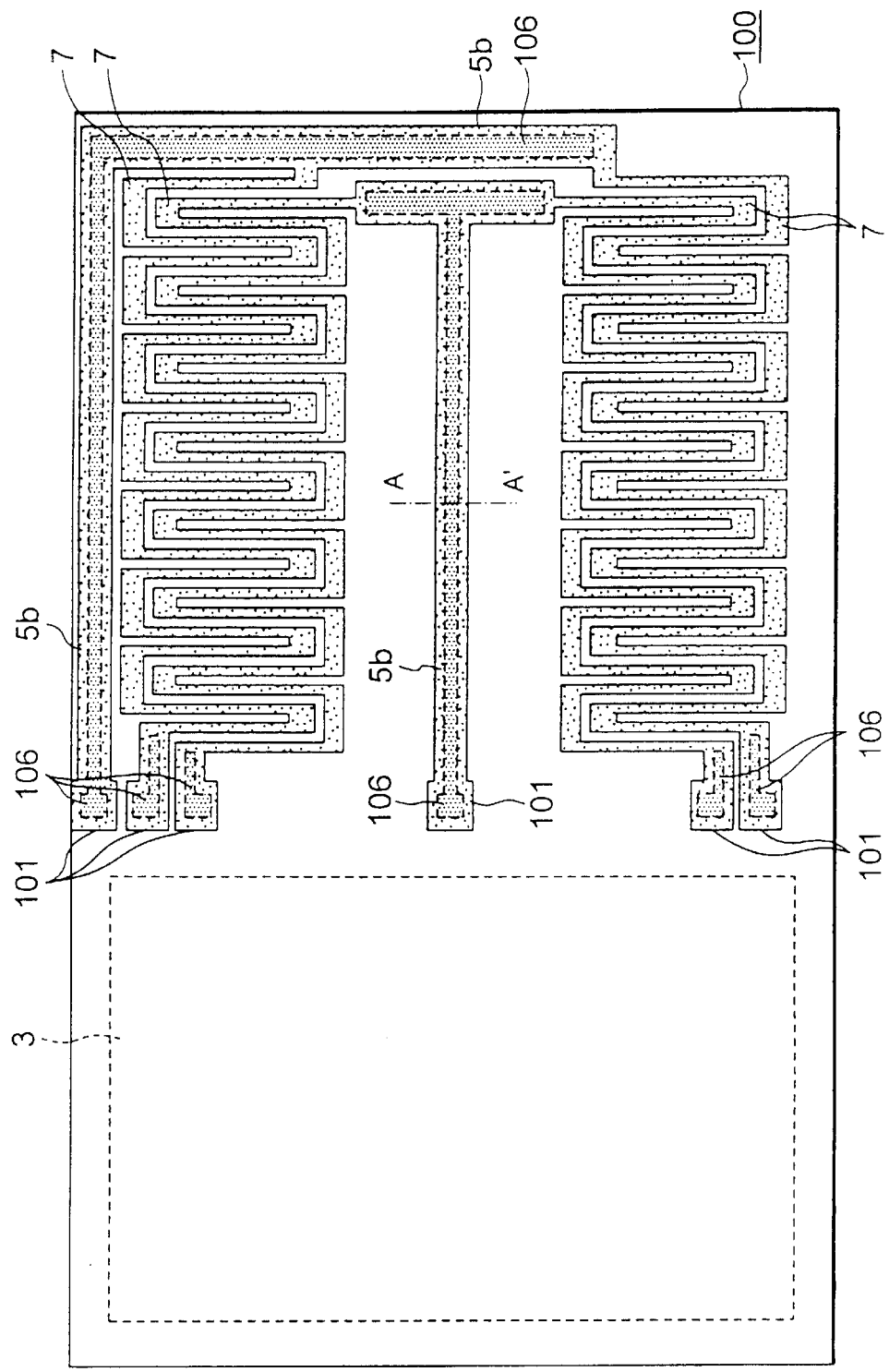
FIG. 46 is a top view transparently showing the structure of a magnetic field sensing element according to Embodiment 9.
Figure 47:
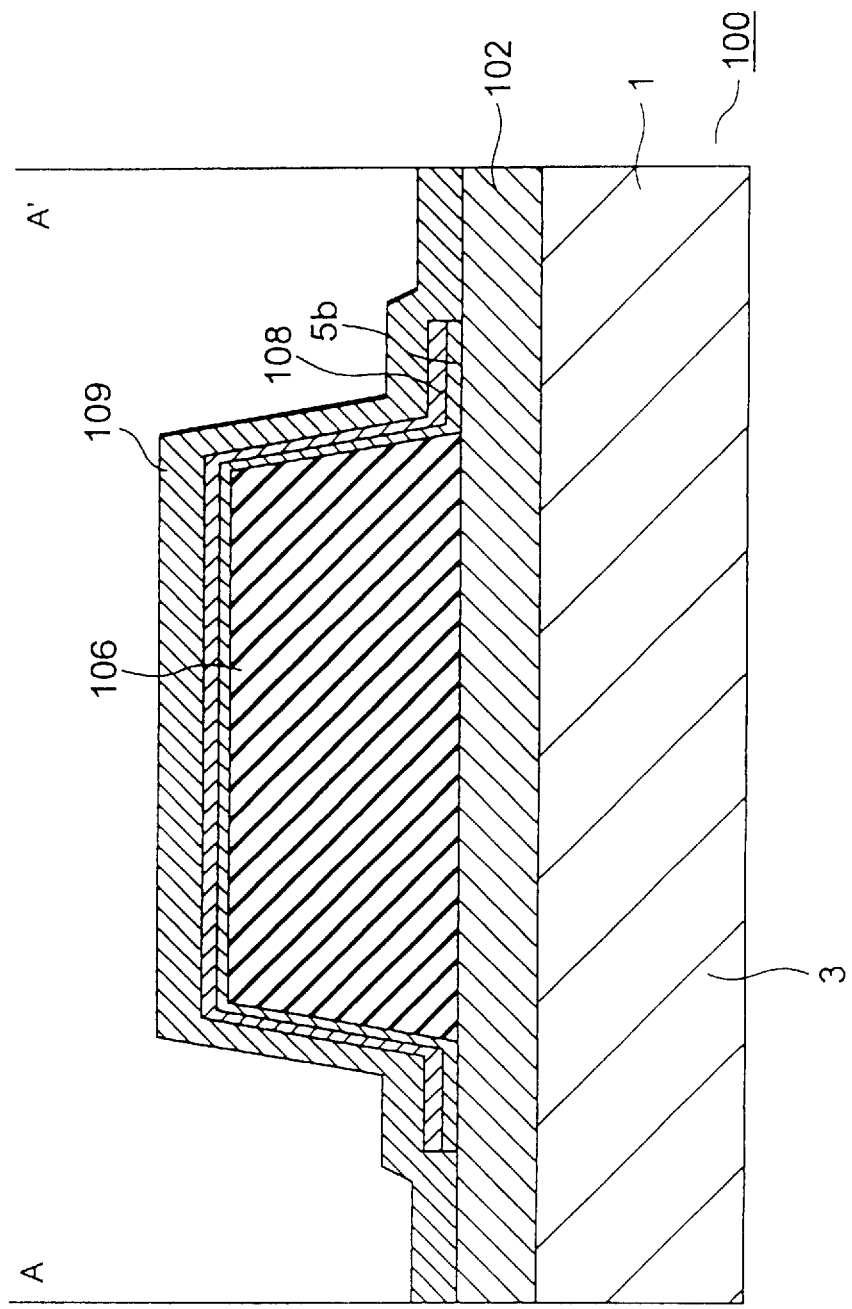
FIG. 47 is a sectional view showing the structure of the magnetic field sensing element cut along line A–A' in FIG. 46.
Figure 48:
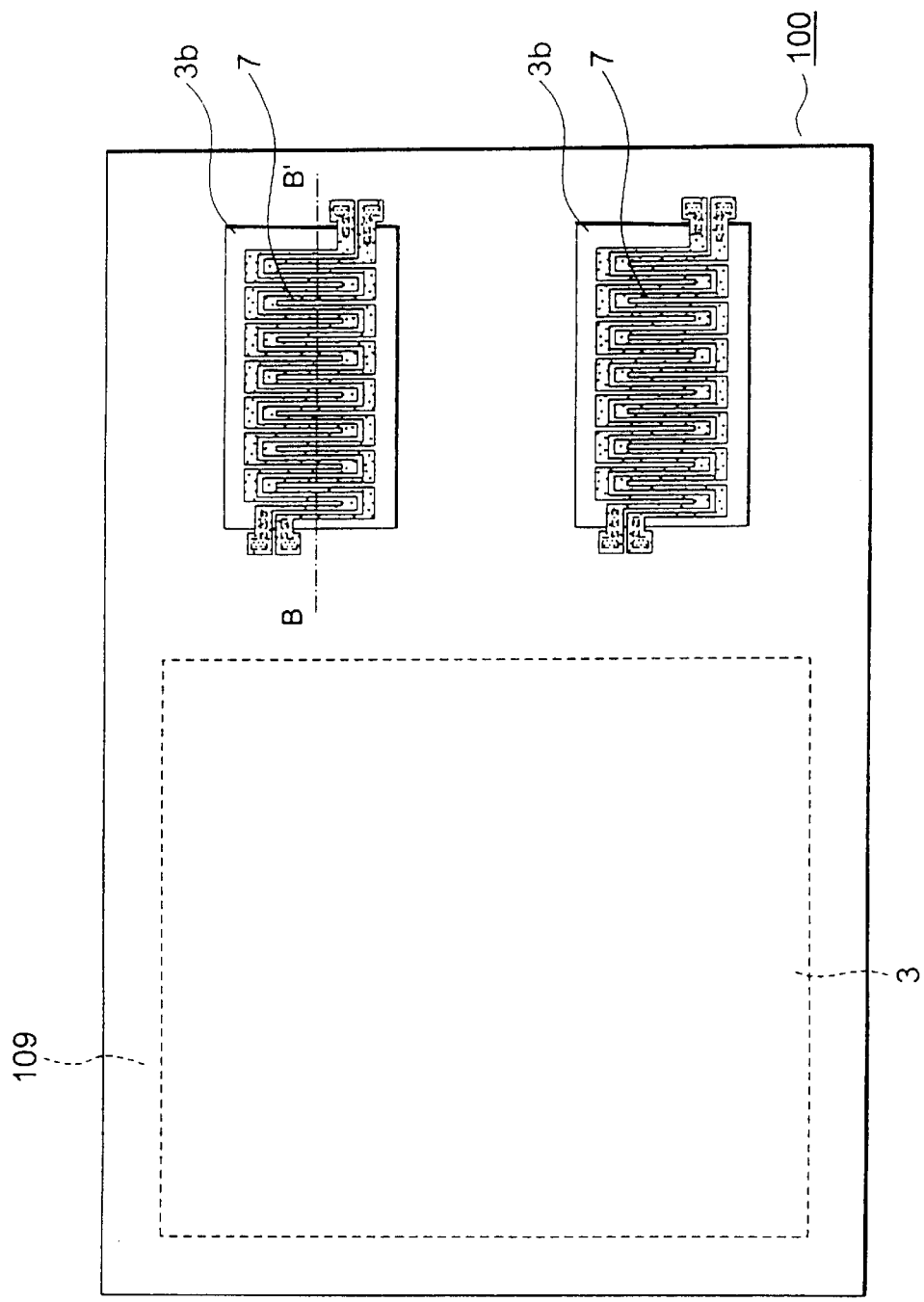
FIG. 48 is a plan view showing the structure of the magnetic field sensing element according to Embodiment 9.
Figure 49:
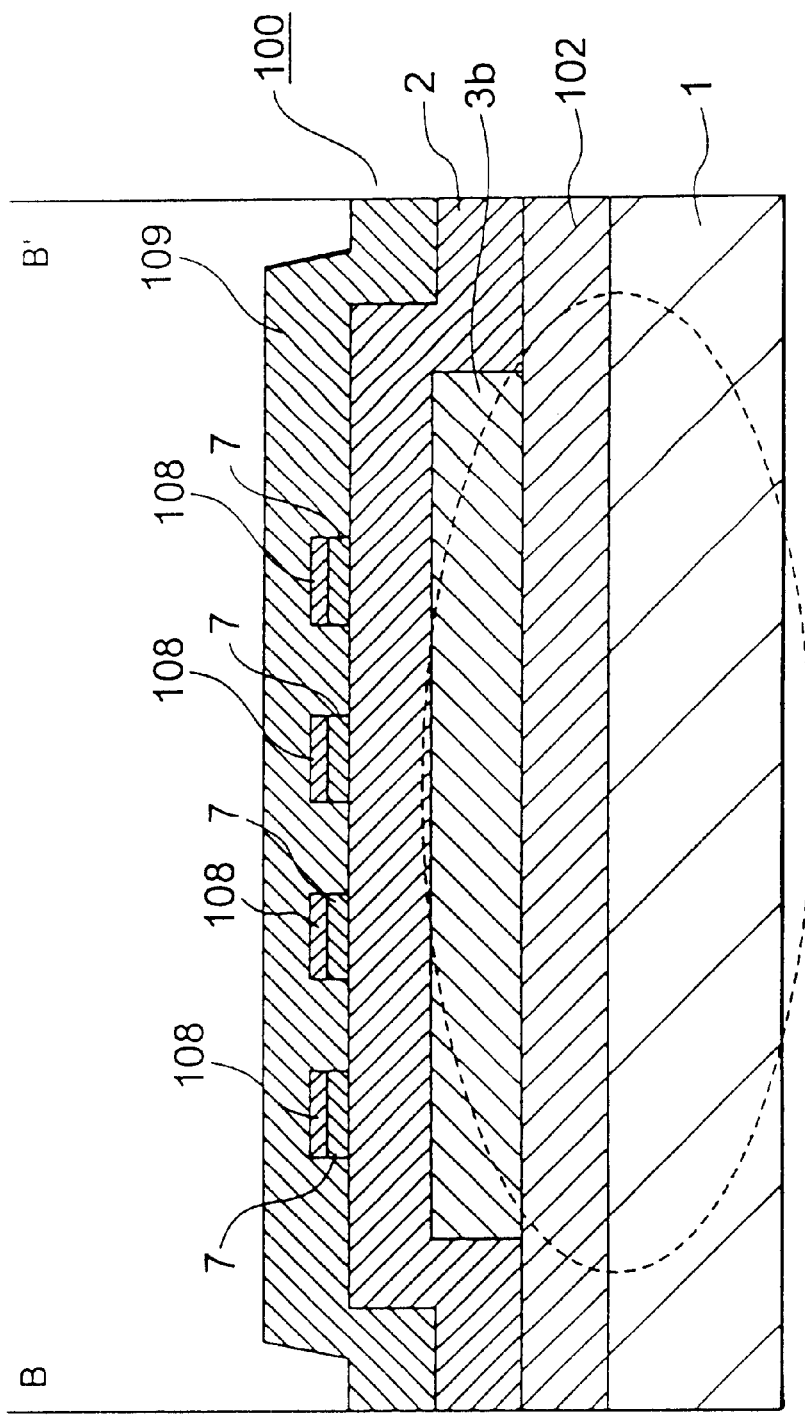
FIG. 49 is a sectional view showing the structure of the magnetic field sensing element cut along line B–B' in FIG. 48.
Figure 50:
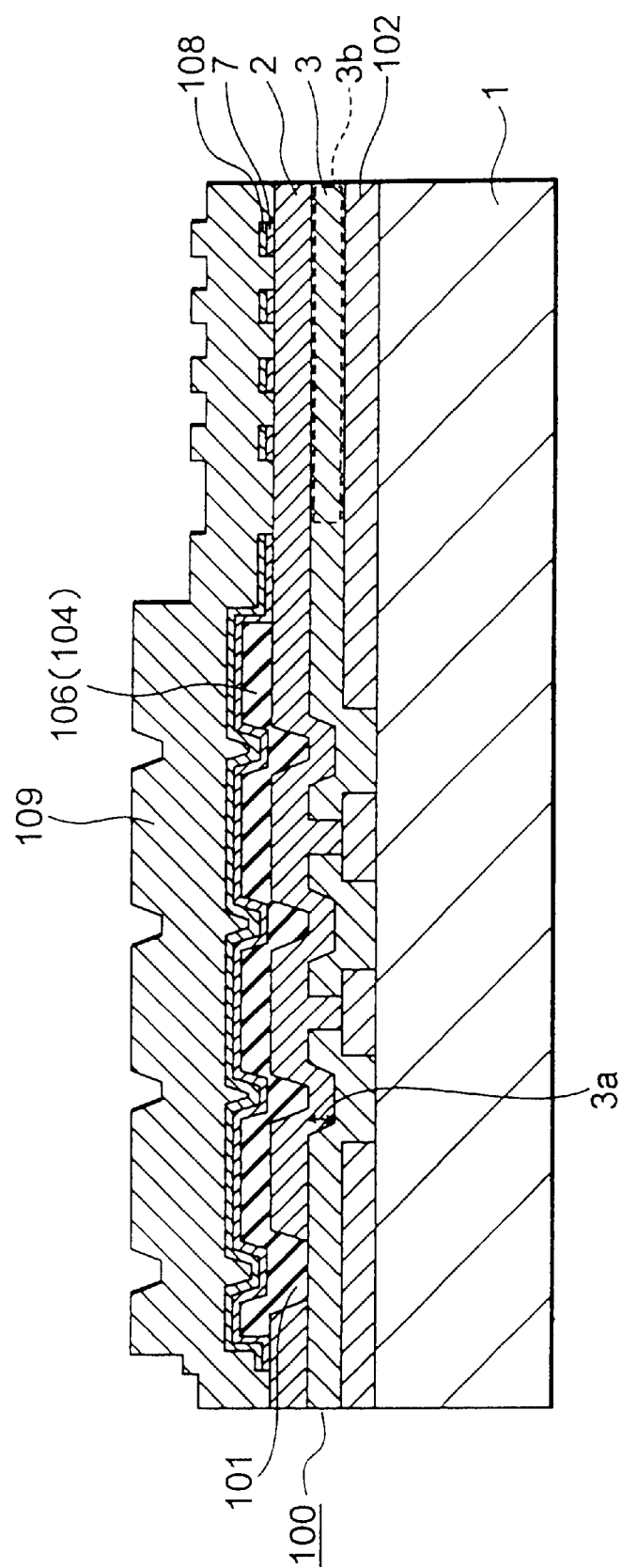
FIG. 50 is a sectional view showing the structure of the magnetic field sensing element according to Embodiment 9.

Specifically, FIG. 46 is a top view transparently showing the structure of a magnetic field sensing element, FIG. 48 is a plan view showing the structure of the magnetic field sensing element, FIGS. 47 and 49 are sectional views showing the structure of the magnetic field sensing element cut along line A–A'in FIG. 46 and the line B–B' in FIG. 48, respectively, and FIG. 50 is a sectional view showing the structure of the magnetic field sensing element according to Embodiment 9.

It is to be noted that a GMR element shown in FIG. 46 is, similar to the GMR element 7 shown in FIG. 44, represented in a manner different from the representation way of the GMR element 7 shown in FIG. 1. However, these figures show the GMR elements having the same structure.

As shown in FIG. 50, there is in general a level or height difference 3$a$ on an integrated circuit 3, hence it is unsuitable to form a GMR element on the integrated circuit 3. On the other hand, a flat surface having almost no level difference exists on the top surface of an electrode portion 3$b$, which forms a capacitor 107, of the integrated circuit 3.

The capacitor 107 is composed of the electrode portion 3$b$ as a capacitor portion of the integrated circuit 3 and an Si substrate 1 sandwiching an insulating film 102 therebetween. A flat surface of a relative large area is provided on the top face of electrode portion 3$b$. This flat surface has sufficient flatness to form the GMR element 7 thereon.

Consequently, when the GMR element 7 is formed on the electrode portion 3$b$ of the integrated circuit 3, characteristics of the GMR element 7 is not adversely affected.

Thus, a magnetic field sensing element 100 according to Embodiment 9 of the present invention is, similar to the magnetic field sensing element described in Embodiment 5, used for the magnetic field sensing devices shown in FIGS. 17 and 18, in which, particularly according to Embodiment 9, the GMR element 7 is formed on the electrode portion 3$b$ of the integrated circuit 3.

To form the magnetic field sensing element 100 shown in FIG. 50, firstly, the insulating layer 102, the integrated circuit 3, an underlayer 2 and a second metal layer 104 are formed on the substrate 1 in the order stated. After forming a contact hole 101 in the second metal layer 104, a metal wiring 6 is connected to the second metal layer 104 through the contact hole 101. Here, as described in Embodiment 1, the metal wiring 6 and the integrated circuit are formed of the metal film 4. The second metal layer 104 is used to electrically connect the integrated circuit 3 to the GMR element 7 to be formed subsequently.

Then, the second metal layer 104 is patterned through the photolithographic process and etching step to form a metal wiring 106 as the second wiring. Thereafter, the GMR element 7 is formed on the metal wiring 106 and the underlayer 2.

The GMR element 7 is formed, after patterning the metal wiring 106, by forming a GMR element film 5 and a protective film 108 over the entire surface of the metal wiring 106 and the underlayer 2 and patterning them utilizing the photolithographic technique.

Subsequently, after the GMR element 7 and the protective film 108 are formed, a protective film 109 is further formed to complete the magnetic field sensing element 100 having the structure shown in FIG. 50.

In the manufacturing method-of the magnetic field sensing element 100 described above, the wet etching is preferably employed for the patterning process to form the metal wiring 106 from the second metal layer 104. When utilizing isotropy of the wet etching, the metal wiring 106 can have a tapered shape in section so that the connecting portion between the GMR element 7 and the metal wiring 106 has a sectional shape that is advantageous in terms of strength.

As further shown in FIGS. 46 and 47, the GMR element film is patterned such that not only the connecting portion between the GMR element 7 and the metal wiring 106 but the entire of the metal wiring is coated with the GMR element film, which ensures the electrical connection between the metal wiring 106 and the GMR element 7. Though it is preferable in this case that all of the top surface and the side surface of the metal wiring 106 is coated with the GMR element film, sufficient electrical connection between the metal wiring 106 and the GMR element 7 would be reliabled if coating more than about half of the top surface and the side surface of the metal wiring 106 is effected.

In the manufacturing method of the magnetic field sensing element 100 mentioned above, a case is described in which the GMR element 7 is formed on the underlayer 2 that is formed on the electrode portion 3b of the integrated circuit 3. In the above description, the second metal layer 104 is patterned only as the metal wiring 106.

When the second metal layer-104 is patterned not only as the metal wiring 106 but also as a second integrated circuit (not shown), the underlayer 2 functions as an interlayer insulating film between the integrated circuit 3 and the second integrated circuit.

In this case where a part of the metal wiring 106 is also patterned as the second integrated circuit, an interlayer insulating film (of the same film quality as the underlayer 2) having the flat surface is formed on the electrode portion 3b of the integrated circuit 3. Therefore, the GMR element 7 is appropriately formed on the interlayer insulating film.

As in the above magnetic field sensing element 100 according to Embodiment 9 of the present invention, forming the GMR element 7 on the underlayer 2 on the integrated circuit 3 makes the polishing process unnecessary which has otherwise been required to form a flat surface on which the GMR element 7 is formed, and makes it possible to reduce the area of the substrate 1 as well. Therefore, it is expected to lower the cost and to miniaturize the magnetic field sensing element and hence the magnetic field sensing device using the same.

Embodiment 10

Figure 51:
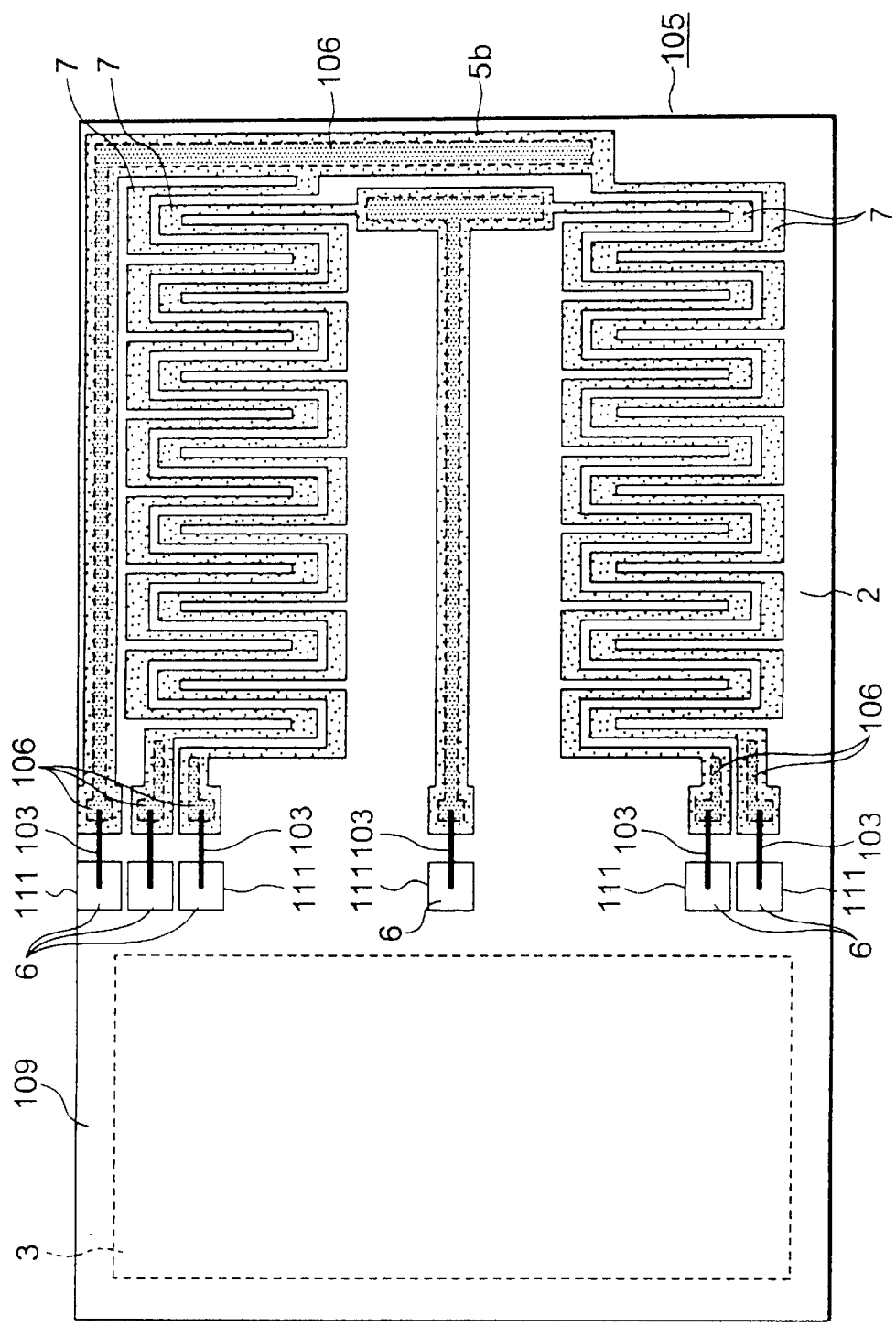
FIGS. 51 is a top view transparently showing the structure of a magnetic field sensing element according to Embodiment 10.
Figure 52:
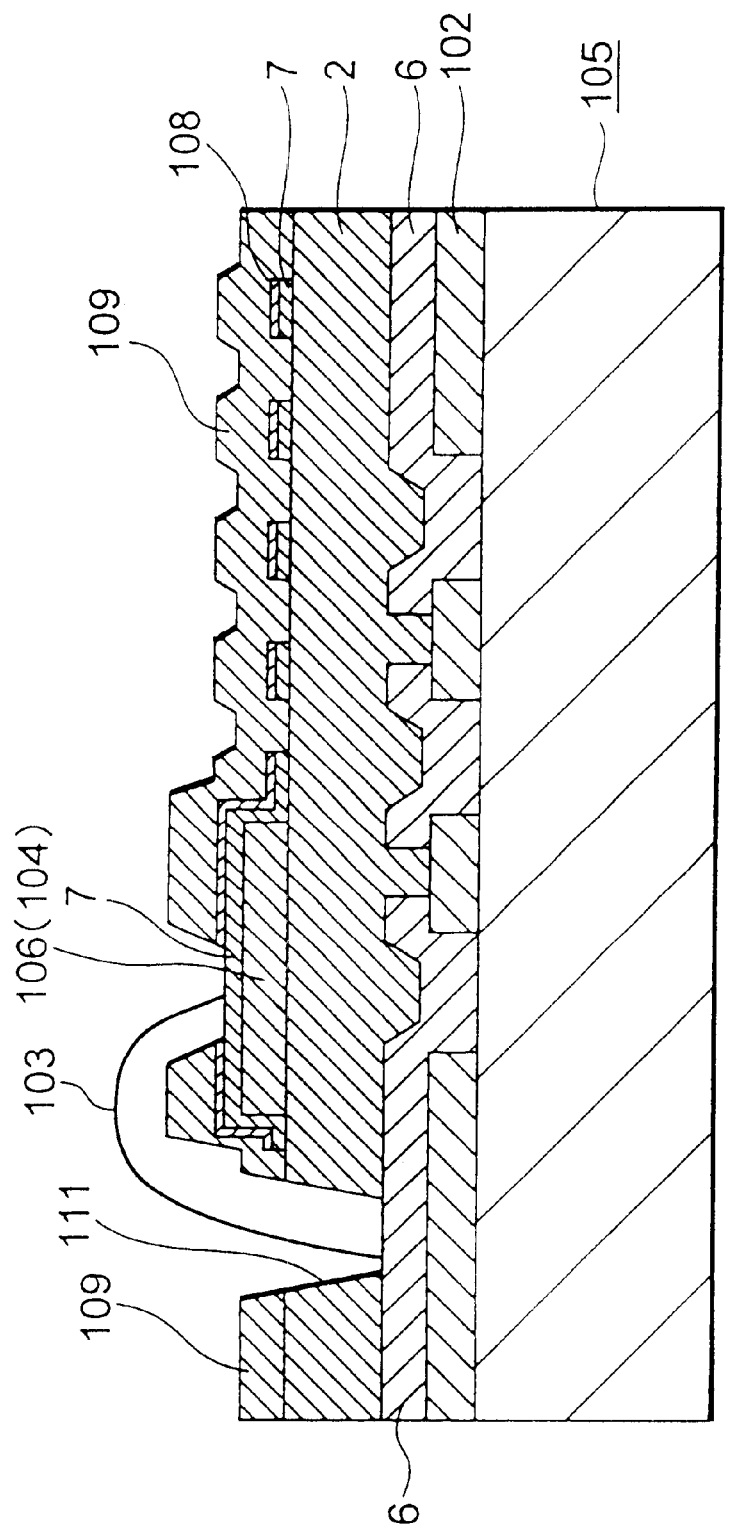
FIGS. 52 is a sectional view showing the structure of the magnetic field sensing element according to Embodiment 10.

FIGS. 51 and 52 are a top view and a sectional view showing a magnetic field sensing element according to Embodiment 10 of the present invention.

Incidentally, a magnetic field sensing element 105 according to Embodiment 10 of the present invention is used for the magnetic field sensing devices shown in FIGS. 17 and 18, similar to the magnetic field sensing element described in Embodiment 5.

As shown in FIG. 52, upon fabrication of the magnetic field sensing element 105, similar to the manufacturing of the magnetic field sensing element 100 in Embodiment 9 shown in FIG. 50, the metal wiring 6, the underlayer 2 and the second metal layer 104 are sequentially formed on the substrate and a GMR element is formed on the underlayer 2. However, the thickness of the underlayer 2 in Embodiment 10 is thicker than that of in Embodiment 9.

The film thickness of the underlayer 2 is thus increased because the underlayer 2 having a sufficient film thickness can provide through heat treatment a surface of sufficient flatness to form the GMR element 7 even when the underlayer 2 is formed on the metal wiring 6.

By thickening the underlayer 2, on the other hand, it becomes difficult to electrically connect the metal wiring 6 with a metal wiring 106 through a contact hole. This is because, while the contact hole can be formed, it is difficult to effectively fill in the contact hole the second metal layer 104 to be formed subsequently to the hole, with the result that the electrical connection between the metal wiring 6 and the metal wiring 106 is not sufficiently reliabled.

Then, in the magnetic field sensing element 105 according to Embodiment 10, holes 111 are formed through the underlayer 2, and the metal wiring 106, formed by patterning the second metal layer through the holes 111, is connected to the metal wiring 6 by a bonding wire 103.

As shown in FIG. 52, the bonding wire 103 is connected between the GMR element 7 and the metal wiring 6, thus the metal wiring 6 and the metal wiring 106 is connected through the GMR element 7 and bonding wire 103. Incidentally, the integrated circuit (not shown) is formed of the same aluminum film as the metal wiring 6.

In this way, when the underlayer 2 is formed thick, the metal wiring 6 can be electrically connected to the metal wiring 106 through the bonding wire 103. With the underlayer 2 having the thus increased thickness, a surface with sufficient flatness can be formed merely through a simple heat treatment such as reflow on the surface of the underlayer 2 formed on the metal wiring 6.

Unlike the magnetic field sensing element 100 according to Embodiment 9, there is no need to take into consideration the level difference caused by the contact hole 101. Accordingly, in this embodiment, the metal wiring 106 can be formed with reduced thickness, whereas Embodiment 9 requires the metal wiring to be formed thick in order to fill the contact hole 101. As a result, the difference in film thickness between the metal wiring 106 and the GMR element 7 can be decreased, thereby making stable the electrical connection at the connecting portion between the metal wiring 106 and the GMR element 7.

Thus, the magnetic field sensing element 105 according to Embodiment 10 of the present invention, a flat surface consitituting the GMR element 7 can be formed by a simple flattening treatment such as heat treatment, so that the area of the substrate 1 may be reduced to miniaturize the magnetic field sensing element and hence the magnetic field sensing device using the same. In addition, the connecting condition between the GMR element 7 and the metal wiring 106 can be made more stable, lowering the cost of fabrication thereof.

Embodiment 11

Figure 53:
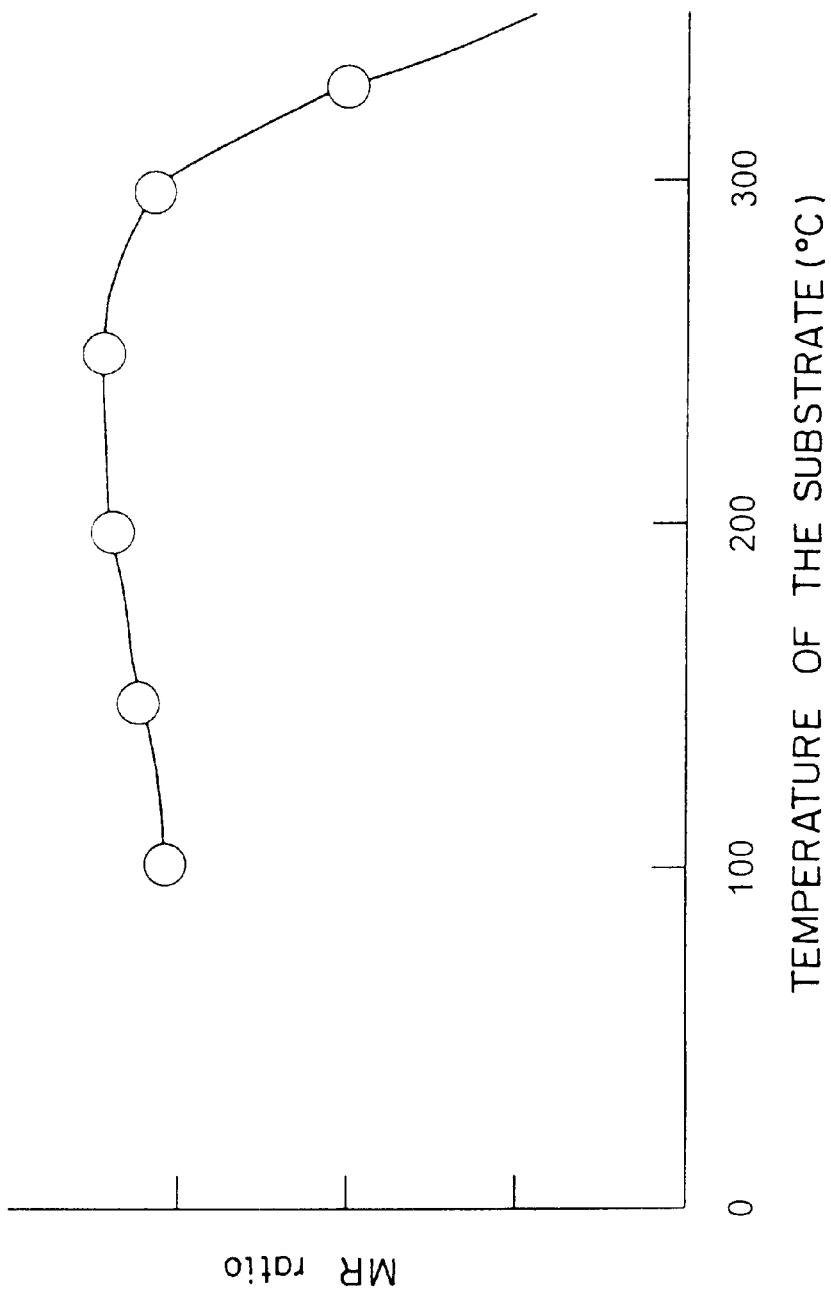
FIG. 53 is a graph showing a heat resisting characteristic of a GMR element used in a magnetic field sensing element according to Embodiment 11.

FIG. 53 is a graph showing characteristics in heat resistance of a magnetic field sensing element according to Embodiment 11 of the present invention.

In the graph shown in FIG. 53, the abscissa represents a substrate temperature at the formation of a protective film on the GMR element 7, and the ordinate represents the MR ratio (Magnetoresistance Ratio) of the GMR element 7. In Embodiment 11, a film obtained by repeatedly laminating a Fe(x)Co(1−x) film (0 ≦x≦0.3) and a Cu film is used as the GMR element 7. The thickness of the Cu film per layer in this lamination body is set to such a value(about 20 Å) that causes the MR ratio in one layer of Cu to be around a second peak.

The graph in FIG. 53 shows that the MR ratio of the GMR element 7 rapidly declines when heated above 300° C. in the substrate temperature.

The substrate temperature of the magnetic field sensing element according to Embodiment 11 of the present invention is limited to 300° C. or lower at a step of forming protective films 108 and 109 on the GMR element 7 comprising the Fe(x)Co(1−x) films (0≦x≦0.3) and the Cu films laminated one over the other.

In this case, as shown in FIG. 53, the characteristics of the GMR element 7 rapidly declines when the substrate temperature exceeds 300° C. Since the GMR element 7 is a metal film comprising a so-called artificial lattice in which magnetic layers and non-magnetic layers are laminated alternately with a thickness of several angstroms to several dozen angstroms, the protective films must be formed after formation of the GMR element 7 so as to reliable the corrosion resistance.

At the formation of these protective films, if the substrate temperature is set to a temperature above 300° C., the characteristics of the GMR element 7 rapidly declines as shown in FIG. 53. Therefore, the protective films 108 and 109 are required to be formed by spattering or by means of cold or low temperature plasma CVD method which does not cause degradation in film quality of the GMR element 7.

When the protective films 108 and 109 are formed by spattering or by means of low temperature plasma CVD method, the substrate temperature does not exceed 300° C., and hence deterioration in the characteristics of the GMR element 7 can be avoided so the magnetic field sensing element with a sufficient durability may be provided.

Embodiment 12

In the magnetic field sensing elements according to Embodiments 1 to 10, the GMR element 7 is patterned in general through the IBE(Ion Beam Etching) method.

Then, for instance, in the case, where GMR element film 5 is patterned so that only a portion used as the GMR element 7 is left unremoved as in Embodiment 1, ion collisions generate the electric charge on the surface of the magnetic field sensing element. There is a fear that this electric charge may reaches the integrated circuit 3 through the sidewalls of the GMR element 7 to damage the integrated circuit 3.

Figure 54:
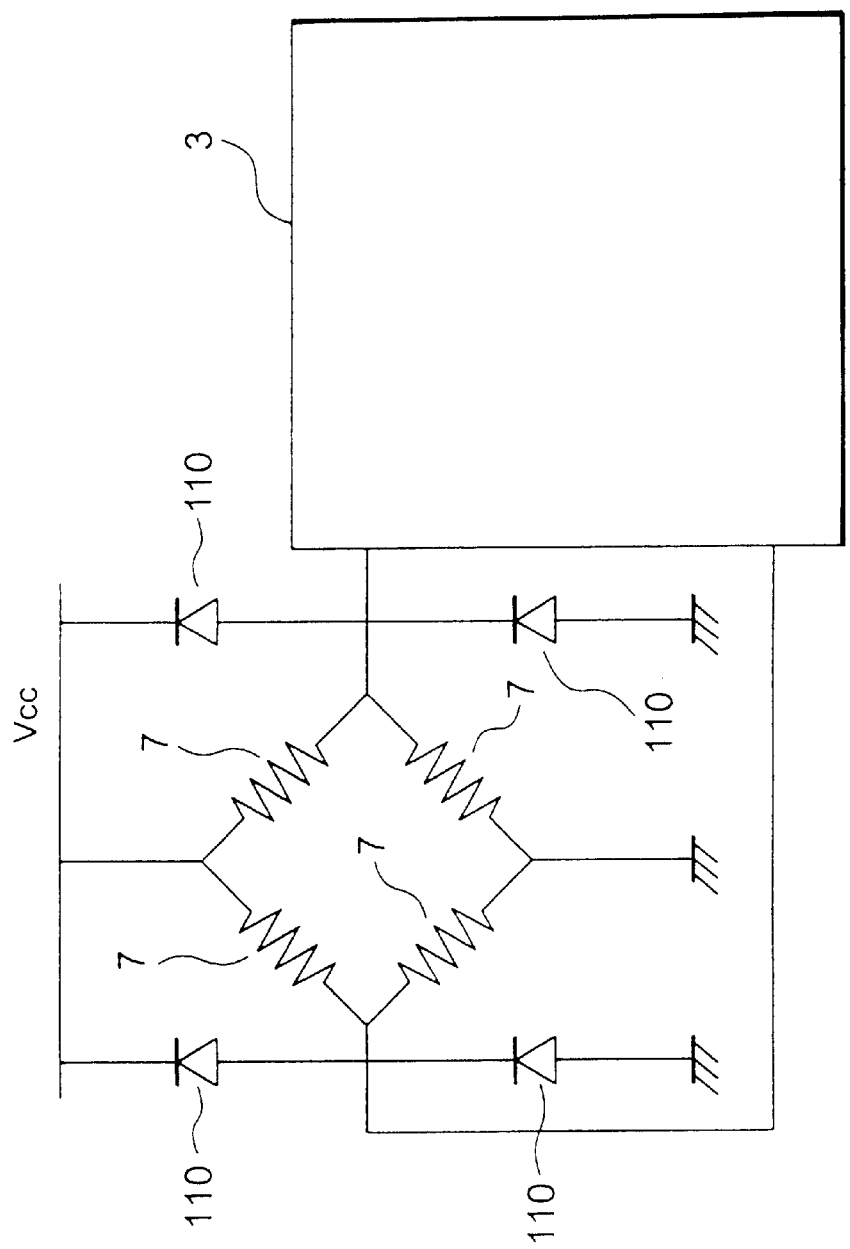
FIG. 54 is a block diagram conceptually showing the structure of a magnetic field sensing element according to Embodiment 12.

FIG. 54 is a conceptual block diagram showing the structure of a magnetic field sensing element according to Embodiment 12.

The magnetic field sensing element according to Embodiment 12 is provided with a protective diode 110 arranged between the integrated circuit 3 and the GMR element 7. This protective diode 110 can prevent the electric charge from flowing into the integrated circuit 3 even if the surface of the GMR element 7 is electrified with the electric charge in the IBE process to pattern the GMR element 7. Incidentally, the protective diode 110 can prevent the electric charge from flowing into the integrated circuit 3 not only when the electric charge is generated on the surface of the magnetic field sensing element during the IBE process mentioned above, but when, for instance, the electric charge is generated on the surface of the magnetic field sensing element during other process such as the film formation process of the underlayer 2.

As a result, the integrated circuit 3 can be prevented from being damaged by the incoming electric charge, thus improving the reliability of the magnetic field sensing element.

According to the present invention, the following advantages can be obtained. Since a magnetic field sensing element comprises an underlayer formed on a substrate, a giant magnetoresistance element formed on the underlayer for detecting a change in a magnetic field, and an integrated circuit formed on the substrate for carrying out predetermined arithmetic processing based on a change in a magnetic field detected by the giant magnetoresistance element, and the giant magnetoresistance element and the integrated circuit are formed on the same surface, the productivity of the magnetic field sensing element can be improved and the cost can be lowered.

Further, since a metal film formed on the underlayer for forming the integrated circuit, not in a region for forming the integrated circuit, is patterned to form wiring for connecting the giant magnetoresistance element and the integrated circuit, it is not necessary to form new wiring for connection. Accordingly, a magnetic field sensing element with low cost and good productivity can be formed.

Still further, since the wiring is formed by wet etching the metal film and has a tapered shape in section, the metal film at the connecting portion of the GMR element has a tapered shape in section, and thus, the reliability of the connecting portion can be improved.

Still further, the reliability of the connecting portion can be improved because a first level difference buffer layer is formed on the underlayer in a region for forming the giant magnetoresistance element to decrease a difference in the levels between the surface of the metal film for forming the wiring and a surface for forming the giant magnetoresistance element, and the giant magnetoresistance element is formed on the first level difference buffer layer.

Still further, since the first level difference buffer layer is formed of an insulating layer, and the difference in the levels between the first level difference buffer layer and the surface of the metal film for forming the wiring is sufficiently smaller than the film thickness of the giant magnetoresistance element, there is no level difference at the connecting portion between the GMR element and the metal film, and thus, the reliability of the connecting portion can be improved.

Still further, since the first level difference buffer layer is a resist layer or resin layer having fluid properties formed by spin coating, and the difference in the levels between the first level difference buffer layer and the surface of the metal film for forming the wiring is sufficiently smaller than the film thickness of the giant magnetoresistance element, there is no level difference at the connecting portion between the GMR element and the metal film, and thus, the reliability of the connecting portion can be improved.

Still further, for the purpose of forming the giant magnetoresistance element, after a giant magnetoresistance element film is formed on the entire surface of the integrated circuit and the first wiring, a portion of the giant magnetoresistance element film on the first wiring then being removed so that the giant magnetoresistance element film formed on the integrated circuit is left unremoved, a protective film then being formed on the unremoved portion of giant magnetoresistance element film, the integrated circuit is kept from being damaged by the patterning of the GMR element, and thus, the reliability of the magnetic field sensing element can be improved.

Still further, since a magnetic field sensing element in another embodiment of the present invention comprises an integrated circuit, an underlayer, and a metal pad formed on the substrate in the order stated, provided with a second level difference buffer layer formed on the underlayer and the metal pads to absorb the difference of the levels between the surface of the underlayer and the surface of the metal pads, and a giant magnetoresistance element formed on the second level difference buffer layer, the area of the substrate can be reduced, and thus, a low-cost magnetic field sensing element can be obtained. Further, there is an advantage in that the magnetic field sensing element can be miniaturized.

Still further, since the second level difference buffer layer has a surface smoothed by polishing, and the giant magnetoresistance element is formed on the smoothed surface of the second level difference buffer layer, the GMR element is formed on the integrated circuit the unevenness of which is smoothed by the polishing process, and thus, there is an advantage in that a highly accurate magnetic field sensing element can be obtained.

Still further, since the second level difference buffer layer is formed from a resist layer or resin layer having a smoothed surface formed by spin coating, and the giant magnetoresistance element is formed on the smoothed resist layer or resin layer, there is an advantage in that a highly accurate magnetic field sensing element can be obtained.

Still further, since a magnetic field sensing element in still another embodiment of the present invention comprises an underlayer formed on one surface of a substrate, a giant magnetoresistance element formed on the underlayer for detecting a change in a magnetic field, and an integrated circuit formed on the surface opposite to the surface where the giant magnetoresistance element of the substrate is formed for carrying out predetermined arithmetic processing based on a change in a magnetic field detected by the giant magnetoresistance element, the area of the substrate can be reduced, and thus, there is an advantage in that a low-cost magnetic field sensing element can be obtained. Further, there is an advantage in that the magnetic field sensing element can be miniaturized.

Still further, since an underlayer and a giant magnetoresistance element are further formed on the integrated circuit formed on the opposite surface of the substrate, there is an advantage in that a highly accurate magnetic field sensing element can be obtained. Further, there are advantages in that the area of the substrate can be reduced, a low-cost magnetic field sensing element can be obtained, and the magnetic field sensing element can be miniaturized.

Still further, since a film, which is identical with the film composing the giant magnetoresistance element, is formed on the first wiring, the first metal wiring can be electrically connected to the giant magnetoresistance element in a reliable manner.

Still further, since more than half of the top surface and the side surface of the first wiring is coated with the same film that forms the giant magnetoresistance element, better electrical connection can be obtained between the first metal wiring and the giant magnetoresistance element.

Still further, since a magnetic field sensing element comprising an integrated circuit formed on a substrate and having a capasitor portion, an underlayer formed on the integrated circuit, a second metal layer formed on the underlayer, and a giant magnetoresistance element formed on the capacitor portion of the integrated circuit, the area of the substrate can be reduced without performing the flattening treatment to obtain the magnetic field sensing element at low cost. Also, the magnetic field sensing element can be miniaturized.

Still further, the giant magnetoresistance element is connected with the integrated circuit through a second wiring formed by patterning the second metal layer, the thickness of the underlayer can advantageously be increased so that the area of the substrate can be reduced without performing the flattening treatment other than heat treatment, and the film thickness of the second metal layer can advantageously be reduced so that the reliability of the connecting portion of the second metal layer to the giant magnetoresistance element can be improved. Also, the magnetic field sensing element can be miniaturized.

Still further, since a film, which is identical with the film composing the giant magnetoresistance element, is formed on the second wiring, reliable electrical connection between the second wiring and the giant magnetoresistance element can be ensured.

Still further, since more than half of the top surface and the side surface of the second wiring is coated with the same film that forms the giant magnetoresistance element, better electrical connection can be obtained between the second wiring and the giant magnetoresistance element.

Still further, since the giant magnetoresistance element is connected with the integrated circuit through a bonding wire, sufficient flatness to form the giant magnetoresistance element can be held by merely heat treating the underlayer without polishing the surface of the underlayer.

Still further, since the giant magnetoresistance element is formed by repeatedly laminating a Fe(x)Co(1−x) layer ($0 \leq x \leq 0.3$) and a Cu layer, film thickness of the Cu layers per layer being set to such a film thickness that causes the change rate of magnetoresistance in a layer of the Cu layers to be around the second peak, and since protective films on the giant magnetoresistance element is formed by spin coating or by means of low-thermal plasma CVD method, sufficient durability can be ensured in the magnetic field sensing element without degrading the characteristics of the GMR element.

Still further, since a diode is formed between the giant magnetoresistance element and the integrated circuit, damage can be eliminated which may be done to the integrated circuit by the electric charge in the electrified magnetic field sensing element in the formation step of the GMR element, and hence the magnetic field sensing element with high reliability is provided.

Still further, since the average surface roughness of the underlayer is 50 Å or less, there is an advantage in that a highly accurate magnetic field sensing element can be obtained.

Still further, since the average of the surface roughness of the underlayer is between 1 Å and 25 Å, there is an advantage in that a highly accurate magnetic field sensing element can be obtained.

Still further, since the magnetic field sensing element comprises a differential amplifier and a comparator on a line for transmitting output of the giant magnetoresistance element to the integrated circuit, and since the comparator sets the output of the differential amplifier which is constant irrespective of the distance between the giant magnetoresistance element and the object to be observed by the giant magnetoresistance element, as the criterion for determining the position of the object to be observed, there is an advantage in that a magnetic field sensing element with high accuracy can be obtained.

Further, a magnetic field sensing device is provided which comprises a magnetic rotating body being rotatable about the rotation axis and having a concavity and a convexity along its outer periphery, a magnet disposed so as to face the outer periphery of the magnetic rotating body and a magnetic field sensing element, which is attached to the magnet surface opposing the outer periphery of the magnetic rotating body, wherein the magnetic field sensing element detects a change in a magnetic field generated between the magnetic rotating body and the magnet during the rotation of the magnetic rotating body, and wherein the device detects a rotation amount of the magnetic rotating body on the basis of the detected change in the magnetic field. With this arrangement, the productivity of the magnetic field sensing device can be improved and the cost of fablication can be lowered.

What is claimed is:

1. A magnetic field sensing element comprising:
   an underlayer formed on a substrate;
   a giant magnetoresistance element for detecting a change in a magnetic field;
   an integrated circuit formed on said underlayer for carrying out predetermined arithmetic processing based on a change in a magnetic field detected by said giant magnetoresistance element;
   a first wiring for connecting said giant magnetoresistance element and said integrated circuit, said first wiring formed on said underlayer from a metal film for forming said integrated circuit which is not in a region for forming said integrated circuit; and
   a first level difference buffer layer formed on said underlayer in a region for forming said giant magnetoresistance element to decrease a difference in the levels between the surface of said first wiring and a surface for forming said giant magnetoresistance element, wherein said giant magnetoresistance element is formed on said first level difference buffer layer.

2. A magnetic field sensing element as claimed in claim 1, wherein said first wiring is formed by wet etching of said metal film and has a tapered shape in section.

3. A magnetic field sensing element as claimed in claim 1, wherein said first level difference buffer layer is formed of an insulating layer, and the level difference between said first level difference buffer layer and said surface of said metal film for forming said first wiring is sufficiently smaller than the film thickness of said giant magnetoresistance element.

4. A magnetic field sensing element as claimed in claim 3, wherein said first level difference buffer layer is a fluidized resist layer or resin layer having fluid properties formed by spin coating, and the level difference between said first level difference buffer layer and said surface of said metal film for forming said first wiring is sufficiently smaller than the film thickness of said giant magnetoresistance element.

5. A magnetic field sensing element as claimed in claim 1, wherein, for the purpose of forming said giant magnetoresistance element, after a giant magnetoresistance element film is formed on the entire surface of said integrated circuit and said first wiring, a portion of said giant magnetoresistance element film on said first wiring then being removed so that the giant magnetoresistance element film formed on said integrated circuit is left unremoved, a protective film then being formed on said unremoved portion of giant magnetoresistance element film.

6. A magnetic field sensing element comprising:
   an integrated circuit, an underlayer, and a metal pad formed on a substrate in the order stated;
   a level difference buffer layer formed on said underlayer and said metal pad to decrease a difference in levels between the surface of said underlayer and the surface of said metal pad; and
   a giant magnetoresistance element formed on said level difference buffer layer.

7. A magnetic field sensing element as claimed in claim 6, wherein said level difference buffer layer has a surface that is smoothed by polishing, and said giant magnetoresistance element is formed on said smoothed surface of said level difference buffer layer.

8. A magnetic field sensing element as claimed in claim 6, wherein said level difference buffer layer is a resist layer or resin layer having a smoothed surface formed by spin coating and said giant magnetoresistance element is formed on said smoothed surface of said resist layer or resin layer.

9. A magnetic field sensing element comprising:
   a substrate;
   an underlayer formed on a first surface of the substrate;
   a giant magnetoresistance element formed on said underlayer, for detecting a change in a magnetic field; and
   an integrated circuit formed on a second surface of the substrate opposite to the first surface where said giant magnetoresistance element of said substrate is formed, for carrying out predetermined arithmetic processing based on a change in a magnetic field detected by said giant magnetoresistance element.

10. A magnetic field sensing element as claimed in claim 9, wherein an underlayer and a giant magnetoresistance element are further formed on said integrated circuit formed on the other surface of said substrate.

11. A magnetic field sensing element as claimed in claim 1, wherein a film, which is identical with the film composing said giant magnetoresistance element, is formed on said first wiring.

12. A magnetic field sensing element comprising an integrated circuit formed on a substrate and having a capacitor portion, an underlayer formed on said integrated circuit, a second metal layer formed on said underlayer, and a giant magnetoresistance element formed on the capacitor portion of said integrated circuit.

13. A magnetic field sensing element as claimed in claim 12, wherein said giant magnetoresistance element is connected with said integrated circuit through a second wiring which is formed by patterning said second metal layer.

14. A magnetic field sensing element as claimed in claim 12, wherein a film, which is identical with the film composing said giant magnetoresistance element, is formed on said second wiring.

15. A magnetic field sensing element as claimed in claim 6, wherein said giant magnetoresistance element is connected with said integrated circuit through a bonding wire.

16. A magnetic field sensing element as claimed in claim 1, further comprising a diode formed between said giant magnetoresistance element and said integrated circuit.

17. A magnetic field sensing element as claimed in claim 1, wherein mean surface roughness of said underlayer is 50 Å or less.

18. A magnetic field sensing element as claimed in claim 1, further comprising a differential amplifier and a comparator on a line for transmitting output of said giant magnetoresistance element to said integrated circuit, wherein said comparator sets the output of said differential amplifier, being constant irrespective of the distance between said giant magnetoresistance element and said object to be observed by said giant magnetoresistance element, as the criterion for determining the position of an object to be observed.

19. A magnetic field sensing device comprising:

a magnetic rotating body being rotatable about the rotation axis and having a concavity and a convexity along its outer periphery;

a magnet disposed so as to face the outer periphery of said magnetic rotating body; and a magnetic field sensing element as claimed in claim 1, which is attached to said magnet surface opposing the outer periphery of said magnetic rotating body, wherein said magnetic field sensing element detects a change in a magnetic field generated between said magnetic rotating body and said magnet during the rotation of said magnetic rotating body, and wherein said device detects a rotation amount of said magnetic rotating body on the basis of the detected change in the magnetic field.

* * * * *